US 7,544,563 B2

(12) United States Patent
Manning

(10) Patent No.: US 7,544,563 B2
(45) Date of Patent: Jun. 9, 2009

(54) METHODS OF FORMING A PLURALITY OF CAPACITORS

(75) Inventor: H. Montgomery Manning, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 254 days.

(21) Appl. No.: 11/131,575

(22) Filed: May 18, 2005

(65) Prior Publication Data

US 2006/0261440 A1 Nov. 23, 2006

(51) Int. Cl.
*H01L 21/8242* (2006.01)

(52) U.S. Cl. .................. 438/253; 438/254; 438/256; 438/396; 257/E21.396

(58) Field of Classification Search ......... 438/253–256, 438/396
See application file for complete search history.

(56) References Cited

U.S. PATENT DOCUMENTS

| | | | |
|---|---|---|---|
| 4,517,729 A | 5/1985 | Batra | |
| 5,236,860 A | 8/1993 | Fazan et al. | |
| 5,340,763 A | 8/1994 | Dennison | |
| 5,401,681 A | 3/1995 | Dennison | |
| 5,467,305 A | 11/1995 | Bertin et al. | |
| 5,498,562 A | 3/1996 | Dennison et al. | |
| 5,532,089 A | 7/1996 | Adair et al. | |
| 5,604,696 A | 2/1997 | Takaishi | |
| 5,605,857 A | 2/1997 | Jost et al. | |
| 5,652,164 A | 7/1997 | Dennison et al. | |
| 5,654,222 A | 8/1997 | Sandhu et al. | |
| 5,686,747 A | 11/1997 | Jost et al. | |
| 5,702,990 A | 12/1997 | Jost et al. | |
| 5,705,838 A | 1/1998 | Jost et al. | |
| 5,767,561 A | 6/1998 | Frei et al. | |
| 5,821,140 A | 10/1998 | Jost et al. | |
| 5,869,382 A | 2/1999 | Kubota | |
| 5,900,660 A | 5/1999 | Jost et al. | |

(Continued)

FOREIGN PATENT DOCUMENTS

DE        4447804        1/2002

(Continued)

OTHER PUBLICATIONS

J. Banhart, *Aluminum Foams: On the Road to Real Applications*, MRS Bulletin, pp. 290-295 (Apr. 2003).

(Continued)

*Primary Examiner*—Thanh Nguyen
(74) *Attorney, Agent, or Firm*—Wells St. John P.S.

(57) ABSTRACT

The invention includes methods and integrated circuitry. Pillars project outwardly from openings in a first material over individual capacitor storage node locations. Insulative material is deposited over the first material laterally about sidewalls of the projecting pillars, and is anisotropically etched effective to expose underlying first material and leave electrically insulative material received laterally about the sidewalls of the projecting pillars. Openings are formed within a second material to the pillars. The pillars are etched from the substrate through the openings in the second material, and individual capacitor electrodes are formed within the openings in electrical connection with the storage node locations. The individual capacitor electrodes have the anisotropically etched insulative material received laterally about their outer sidewalls. The individual capacitor electrodes are incorporated into a plurality of capacitors. Other implementations and aspects are contemplated.

45 Claims, 18 Drawing Sheets

U.S. PATENT DOCUMENTS

| | | |
|---|---|---|
| 5,955,758 A | 9/1999 | Sandhu et al. |
| 5,981,350 A | 11/1999 | Geusic et al. |
| 5,990,021 A | 11/1999 | Prall et al. |
| 6,037,212 A | 3/2000 | Chao |
| 6,037,218 A | 3/2000 | Dennison et al. |
| 6,059,553 A | 5/2000 | Jin et al. |
| 6,090,700 A | 7/2000 | Tseng |
| 6,108,191 A | 8/2000 | Bruchhaus et al. |
| 6,110,774 A | 8/2000 | Jost et al. |
| 6,133,620 A | 10/2000 | Uochi |
| 6,180,450 B1 | 1/2001 | Dennison |
| 6,204,143 B1 | 3/2001 | Roberts et al. |
| 6,204,178 B1 | 3/2001 | Marsh |
| 6,258,650 B1 | 7/2001 | Sunouchi |
| 6,274,497 B1 | 8/2001 | Lou |
| 6,303,518 B1 | 10/2001 | Tian et al. |
| 6,303,956 B1 | 10/2001 | Sandhu et al. |
| 6,323,528 B1 | 11/2001 | Yamazaki et al. |
| 6,331,461 B1 | 12/2001 | Juengling |
| 6,372,554 B1 | 4/2002 | Kawakita et al. |
| 6,383,861 B1 | 5/2002 | Gonzalez et al. |
| 6,399,490 B1 | 6/2002 | Jammy et al. |
| 6,403,442 B1 | 6/2002 | Reinberg |
| 6,432,472 B1 | 8/2002 | Farrell et al. |
| 6,458,653 B1 | 10/2002 | Jang |
| 6,458,925 B1 | 10/2002 | Fasano |
| 6,459,138 B2 | 10/2002 | Reinberg |
| 6,617,222 B1 | 9/2003 | Coursey |
| 6,645,869 B1 | 11/2003 | Chu et al. |
| 6,656,748 B2 | 12/2003 | Hall et al. |
| 6,667,502 B1 | 12/2003 | Agarwal et al. |
| 6,673,693 B2 | 1/2004 | Kirchhoff |
| 6,709,978 B2 | 3/2004 | Geusic et al. |
| 6,720,232 B1 | 4/2004 | Tu et al. |
| 6,767,789 B1 | 7/2004 | Bronner et al. |
| 6,784,112 B2 | 8/2004 | Arita et al. |
| 6,812,513 B2 | 11/2004 | Geusic et al. |
| 6,822,261 B2 | 11/2004 | Yamakazi et al. |
| 6,844,230 B2 | 1/2005 | Reinberg |
| 6,849,496 B2 | 2/2005 | Jaiprakash et al. |
| 6,893,914 B2 | 5/2005 | Kim et al. |
| 6,897,109 B2 * | 5/2005 | Jin et al. .................. 438/253 |
| 6,927,122 B2 | 8/2005 | Geusic et al. |
| 6,930,640 B2 | 8/2005 | Chung et al. |
| 7,042,040 B2 | 5/2006 | Horiguchi |
| 7,064,365 B2 | 6/2006 | An et al. |
| 7,073,969 B2 | 7/2006 | Kamm |
| 7,074,669 B2 | 7/2006 | Iijima et al. |
| 7,081,384 B2 | 7/2006 | Birner et al. |
| 7,084,451 B2 | 8/2006 | Forbes et al. |
| 7,125,781 B2 | 10/2006 | Manning et al. |
| 7,160,788 B2 | 1/2007 | Sandhu et al. |
| 7,179,706 B2 | 2/2007 | Patraw et al. |
| 7,199,005 B2 | 4/2007 | Sandhu et al. |
| 7,413,952 B2 | 8/2008 | Busch et al. |
| 2001/0012223 A1 | 8/2001 | Kohyama |
| 2001/0026974 A1 | 10/2001 | Reinberg |
| 2001/0044181 A1 | 11/2001 | Nakamura |
| 2002/0022339 A1 | 2/2002 | Kirchhoff |
| 2002/0030221 A1 | 3/2002 | Sandhu et al. |
| 2002/0039826 A1 | 4/2002 | Reingberg |
| 2002/0086479 A1 | 7/2002 | Reinberg |
| 2002/0090779 A1 | 7/2002 | Jang |
| 2002/0098654 A1 | 7/2002 | Durcan et al. |
| 2002/0153589 A1 | 10/2002 | Oh |
| 2002/0153614 A1 | 10/2002 | Ema et al. |
| 2002/0163026 A1 | 11/2002 | Park |
| 2003/0153146 A1 | 8/2003 | Won et al. |
| 2003/0178684 A1 | 9/2003 | Nakamura |
| 2003/0190782 A1 | 10/2003 | Ko et al. |
| 2003/0227044 A1 | 12/2003 | Park |
| 2004/0018679 A1 * | 1/2004 | Yu et al. .................. 438/253 |
| 2004/0056295 A1 | 3/2004 | Agarwal |
| 2004/0150070 A1 | 8/2004 | Okada et al. |
| 2004/0188738 A1 | 9/2004 | Farnworth et al. |
| 2005/0051822 A1 | 3/2005 | Manning |
| 2005/0054159 A1 | 3/2005 | Manning |
| 2006/0014344 A1 | 1/2006 | Manning |
| 2006/0024958 A1 | 2/2006 | Ali |
| 2006/0046420 A1 | 3/2006 | Manning |
| 2006/0051918 A1 | 3/2006 | Busch et al. |
| 2006/0063344 A1 | 3/2006 | Manning et al. |
| 2006/0063345 A1 | 3/2006 | Manning et al. |
| 2006/0115951 A1 | 6/2006 | Mosley |
| 2006/0148190 A1 | 7/2006 | Busch |
| 2006/0186451 A1 | 8/2006 | Dusberg et al. |
| 2006/0211211 A1 | 9/2006 | Sandhu et al. |
| 2006/0249798 A1 | 11/2006 | Manning |
| 2006/0261440 A1 | 11/2006 | Manning |
| 2006/0263968 A1 | 11/2006 | Manning |
| 2007/0032014 A1 | 2/2007 | Sandhu et al. |
| 2007/0048976 A1 | 3/2007 | Raghu |
| 2007/0093022 A1 | 4/2007 | Basceri |
| 2007/0099328 A1 | 5/2007 | Chiang et al. |
| 2007/0145009 A1 | 6/2007 | Fucsko et al. |

FOREIGN PATENT DOCUMENTS

| | | |
|---|---|---|
| KR | 20010061020 | 7/2001 |
| WO | 2004/0027898 | 8/2004 |
| WO | 2004/027898 | 8/2004 |
| WO | 2004/040252 | 12/2004 |
| WO | WO 2005/024936 | 3/2005 |
| WO | 2006/006806 | 2/2006 |
| WO | 2006/06806 | 7/2006 |
| WO | 2006/06806 | 1/2007 |
| WO | 2006/06806 | 3/2007 |

OTHER PUBLICATIONS

D. Crouse et al., *Self-Assembled Nanostructures Using Anodized Alumina Thin Films for Optoelectronic Applications*, IEEE, pp. 234-235 (1999).

L. J. Gibson et al., *Cellular Solids*, MRS Bulletin, pp. 270-274 (Apr. 2003).

D. J. Green et al., *Cellular Ceramics: Intriguing Structures, Novel Properties, and Innovative Applications*, MRS Bulletin, pp. 296-300 (Apr. 2003).

D. J. Green et al., *The Strutcure and Applications of Cellular Ceramics*, MRS Bulletin, 10 pages (Apr. 2003).

J. M. Karp et al., *Scaffolds for Tissue Engineering*, MRS Bulletin, pp. 301-302 (Apr. 2003).

V. V. Konovalov et al., *Chemistry of Materials*, Chem. Mater., vol. 11, No. 8, pp. 1949-1951 (Aug. 1999).

A. M. Kraynik, *Foam Structure: From Soap Froth to Solid Foams*, MRS Bulletin, pp. 275-278 (Apr. 2003).

J. Liang et al., *Nonlithographic Fabrication of Lateral Superlattices for Nanometric Electromagnetic-Optic . . .* IEEE J. Selected Topics in Quantum Electr., vol. 8, No. 5, pp. 998-1008 (Sep./Oct. 2002).

C. Y. Liu et al., *Ordered anodic alumina nanochannels on focused-ion-beam-prepatterned aluminum surfaces* Appl. Phys. Lett., vol. 78, No. 1, pp. 120-122 (Jan. 2001).

E. Marie et al., *In Situ X-Ray Tomography Measurements of Deformation in Cellular Solids*, MRS Bulletin, pp. 284-289 (Apr. 2003).

H. Masuda et al., *Highly ordered nanochannel-array architecture in anodic alumina*, App. Phys. Lett, vol. 71, No. 19, pp. 2770-2772 (Nov. 1997).

A. Nadeem et al., *Fabrication of Microstuctires Using Aluminum Anodization Techinques*, pp. 274-277 (pre-2004).

G. H. Oh et al., *Preparation and Pore-Characteristics Control of Nano-Porous Materials Using Organometallic Building Blocks*, Carbon Science, vol. 4, No. 1, pp. 1-9 (Mar. 2003).

P. R. Onck, *Scale Effects in Cellular Metals*, MRS Bulletin, pp. 279-283 (Apr. 2003).

J.P. O'Sullivan et al., *The morphology and mechanism of formation of porous anodic films on aluminium*, Proc. Rov. Soc. Lond. A, vol. 317, pp. 511-543 (1970).

J. M. Park et al., *Novel Robust Cell Capacitor (Leaning Exterminated Ring Type Insulator) and New Storage Node Contact*, IEEE, 2004 Symposium on VLSI Technology Diges6t of Technical Papers, pp. 34-35.

M. Park et al., *Block Copolymer Lithography: Periodic Arrays of~$10^{11}$ Holes in 1 Square Centimeter*, SCIENCE, vol. 276, pp. 1401-1404 (May 1997).

S. Shingubara, *Fabrication of nanomaterials using porous alumina templates*, J. Nanoparticle Res., vol. 5, pp. 17-30 (2003).

S. Tan et al., *High Aspect Ratio Microstructures on Porous Anodic Aluminum Oxide*, IEEE, pp. 267-272 (1995).

M. Tsukada et al., *Preparation and Application of Porous Silk Fibroin Materials*, J. Appl. Polymer Sci., vol. 54, pp. 507-514 (1994).

U.S. Appl. No. 10/894,633, filed Jul. 2004, Manning.

U.S. Appl. No. 10/928,931, filed Aug. 2004, Busch et al.

U.S. Appl. No. 10/929,037, filed Aug. 2004, Manning.

U.S. Appl. No. 11/006,331, filed Dec. 2004, Basceri et al.

Kim, D.H. et al., "A Mechanically Enhanced Storage Node for Virtually Unlimited Height (MESH) Capacitor Aiming at Sub 70nm DRAMs", IEEE Jan. 2004, pp. 69-72.

U.S. Appl. No. 11/083,489, filed Mar. 2005, Sandhu et al.

U.S. Appl. No. 11/131,552, filed May 2005, Manning.

U.S. Appl. No. 11/196,593, filed Aug. 2005, Sandhu et al.

U.S. Appl. No. 11/360,540, filed Feb. 2006, Rana.

U.S. Appl. No. 11/580,418, filed Oct. 2006, Raghu et al.

Li, X. and Bohn, P.W., "*Metal-assisted chemical etching in $HF/H_2O_2$ produces porous silicon*", Applied Physics Letters, vol. 77, No. 16, Oct. 16, 2000, pp. 2572-2574.

Yasaitis et al., "A moldular process for integrating thick polysilicon MEMS devices with sub-micron CMOS", Analog Devices, Pre-2004.

\* cited by examiner

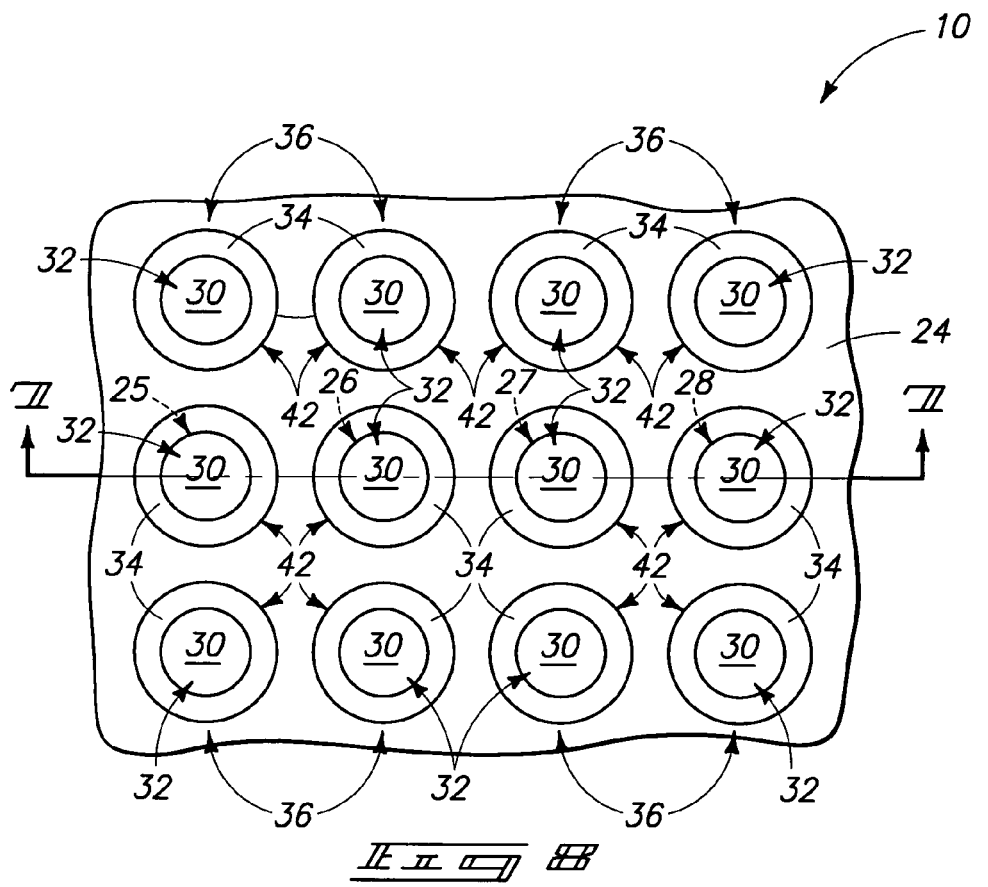
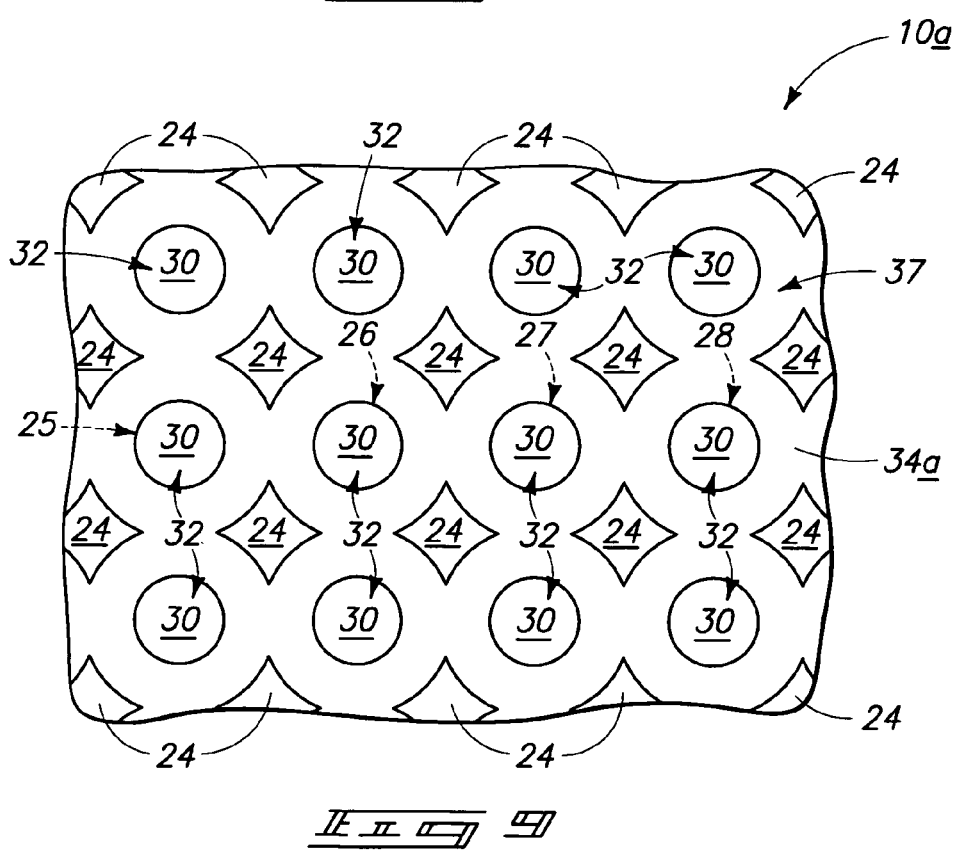

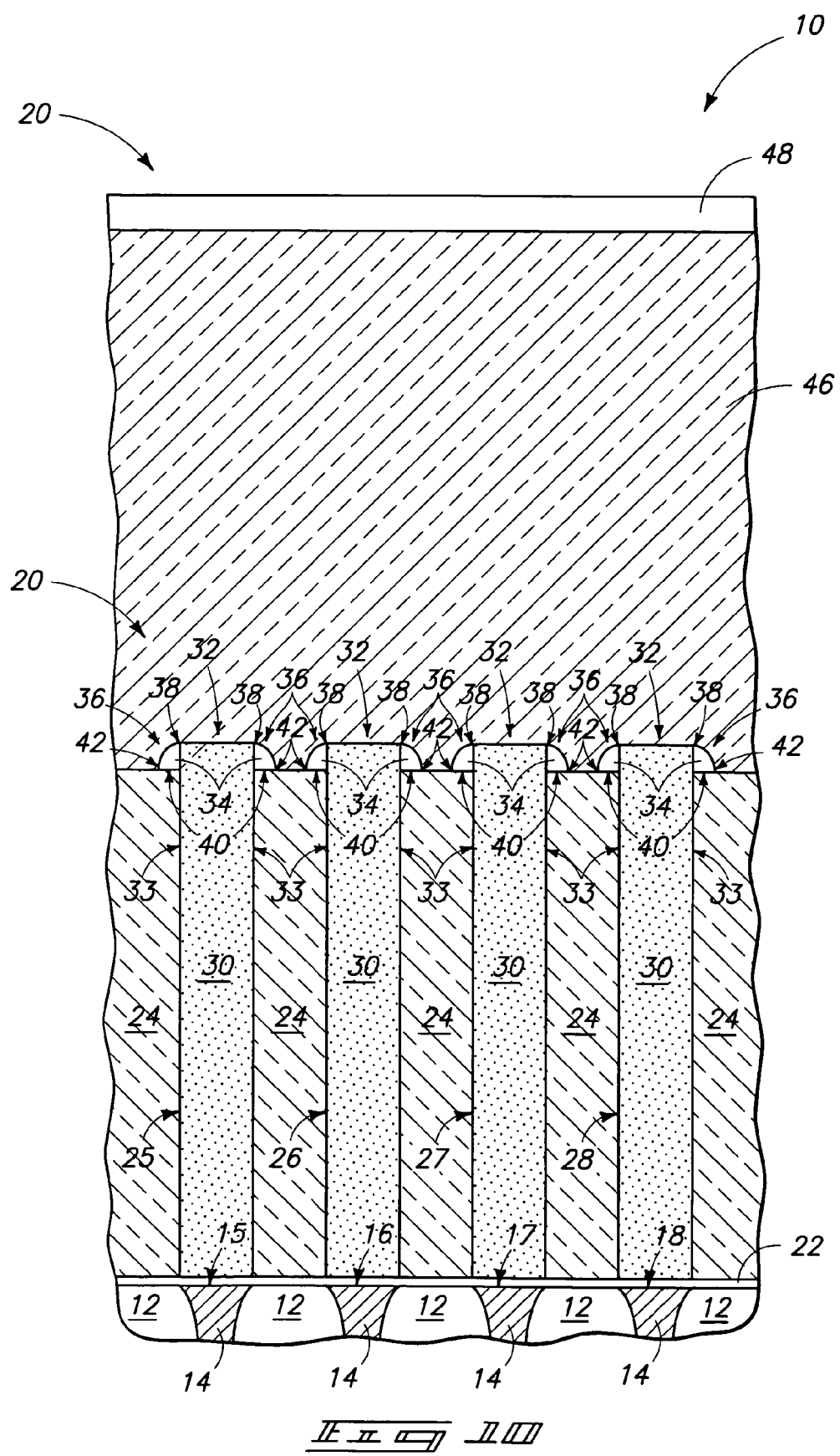

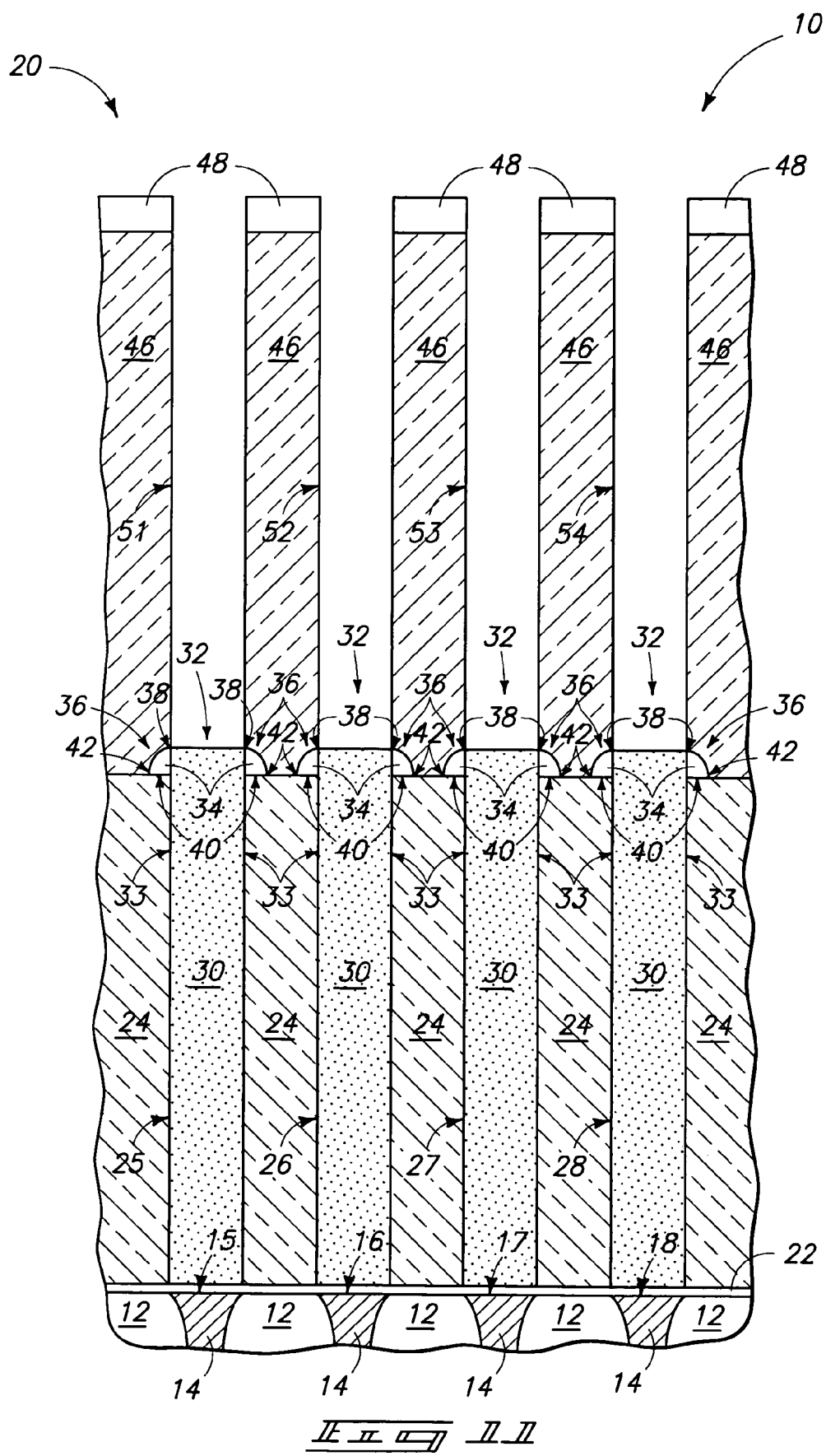

METHODS OF FORMING A PLURALITY OF CAPACITORS

TECHNICAL FIELD

This invention relates to methods of forming a plurality of capacitors, and to integrated circuitry comprising a pair of capacitors independent of method of fabrication.

BACKGROUND OF THE INVENTION

Capacitors are one type of component which is commonly used in the fabrication of integrated circuits, for example in DRAM circuitry. A typical capacitor is comprised of two conductive electrodes separated by a non-conducting dielectric region. As integrated circuitry density has increased, there is a continuing challenge to maintain sufficiently high storage capacitance despite typical decreasing capacitor area. The increase in density of integrated circuitry has typically resulted in greater reduction in the horizontal dimension of capacitors as compared the vertical dimension. In many instances, the vertical dimension of capacitors has increased.

One manner of forming capacitors is to initially form an insulative material within which a capacitor storage node electrode is formed. For example, an array of capacitor electrode openings for individual capacitors is typically fabricated in such insulative capacitor electrode-forming material, with a typical insulative electrode-forming material being silicon dioxide doped with one or both of phosphorus and boron. The capacitor electrode openings are typically formed by etching. However, it can be difficult to etch the capacitor electrode openings within the insulative material, particularly where the openings are deep.

Further and regardless, it is often desirable to etch away most if not all of the capacitor electrode-forming material after individual capacitor electrodes have been formed within the openings. Such enables outer sidewall surfaces of the electrodes to provide increased area, and thereby increased capacitance for the capacitors being formed. However, the capacitor electrodes formed in deep openings are typically correspondingly much taller than they are wide. This can lead to toppling of the capacitor electrodes either during the etch to expose the outer sidewall surfaces, during transport of the substrate, and/or during deposition of the capacitor dielectric layer or outer capacitor electrode layer. Our U.S. Pat. No. 6,667,502 teaches provision of a brace or retaining structure intended to alleviate such toppling.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

The invention includes methods of forming a plurality of capacitors, and integrated circuitry comprising a pair of capacitors independent of method of fabrication. In one implementation, a method of forming a plurality of capacitors includes forming sacrificial material pillars projecting outwardly from openings in a first material over individual capacitor storage node locations within a capacitor array area over a substrate. Electrically insulative material different in composition from the first material is deposited over the first material laterally about sidewalls of the projecting pillars. Such material is anisotropically etched without masking it anywhere within the capacitor array effective to expose underlying first material and leave electrically insulative material received laterally about the sidewalls of the projecting pillars. Openings are formed within a second material to the pillars. The second material is different in composition from the electrically insulative material and from the pillars. The pillars are etched from the substrate through the openings in the second material, and individual capacitor electrodes are formed within the openings in electrical connection with the capacitor storage node locations. The individual capacitor electrodes have the anisotropically etched electrically insulative material received laterally about outer sidewalls of the individual capacitor electrodes. The individual capacitor electrodes having the anisotropically etched electrically insulative material received laterally about the capacitor electrode outer sidewalls are incorporated into a plurality of capacitors.

In one implementation, a pair of adjacent capacitors includes a substrate comprising substantially vertically oriented inner capacitor electrodes having respective elevationally outermost and elevationally innermost surfaces. The inner capacitor electrodes have outer sidewalls. An electrically insulative ring is received laterally about each of the inner capacitor electrode outer sidewalls at some common substrate elevation intermediate said outermost and innermost surfaces. The insulative rings are spaced from one another. A capacitor dielectric layer is received over each of the insulative rings and over the inner capacitor electrodes. An outer capacitor electrode is received over each of the insulative rings and over the capacitor dielectric layer.

In one implementation, a pair of adjacent capacitors includes a substrate comprising substantially vertically oriented inner capacitor electrodes having respective elevationally outermost and elevationally innermost surfaces. The inner capacitor electrodes have outer sidewalls. An electrically insulative ring is received laterally about each of the inner capacitor electrode outer sidewalls at some common substrate elevation intermediate said outermost and innermost surfaces. The insulative rings each have a laterally peripheral surface. Such peripheral surfaces of each ring touch one another intermediate the pair of adjacent capacitors. A capacitor dielectric layer is received over each of the insulative rings and over the inner capacitor electrodes. An outer capacitor electrode is received over each of the insulative rings and over the capacitor dielectric layer.

Other aspects and implementations are contemplated.

BRIEF DESCRIPTION OF THE DRAWINGS

Preferred embodiments of the invention are described below with reference to the following accompanying drawings.

FIG. 8 is a diagrammatic top plan view of the FIG. 7 substrate.

FIG. 9 is a diagrammatic top plan view of an alternate substrate to that depicted by FIG. 8.

FIG. 10 is a view of the FIG. 7 substrate at a processing step subsequent to that shown by FIG. 7.

FIG. 11 is a view of the FIG. 10 substrate at a processing step subsequent to that shown by FIG. 10.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
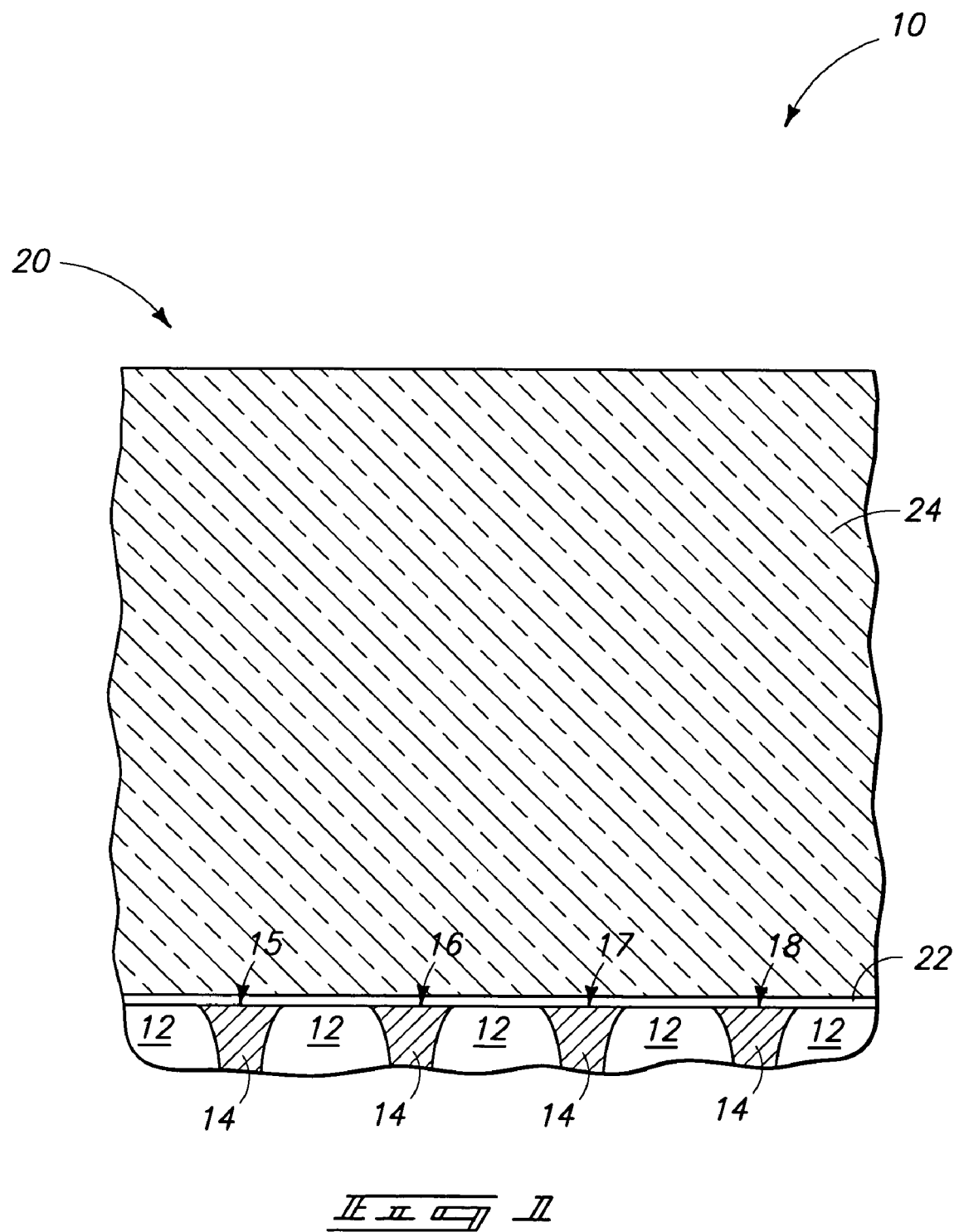
FIG. 1 is a diagrammatic cross section of a substrate fragment in process in accordance with an aspect of the invention.

Exemplary preferred methods of forming a plurality of capacitors are described with reference to FIGS. 1-19. FIG. 1 depicts a substrate 10 preferably comprising a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Accordingly and by way of example only, FIG. 1 might comprise a bulk semiconductor material (not shown), for example bulk monocrystalline silicon and/or alternately comprise semiconductor-on-insulator layers.

FIG. 1 depicts an insulative material 12 having electrically conductive storage node pillars 14 formed therethrough. Materials 12 and 14 would typically be fabricated over some suitable underlying material, for example bulk monocrystalline silicon and/or other underlying circuitry. An exemplary insulative material 12 includes doped and undoped silicon dioxides, for example silicon dioxide deposited by decomposition of tetraethyl orthosilicate (TEOS) and/or borophosphosilicate glass (BPSG) and/or silicon nitride. Alternately by way of example only, material 12 might comprise anisotropically etched insulative spacers, for example formed about transistor gate lines. An exemplary preferred conductive material 14 is conductively doped polysilicon. Conductive material 14 can be considered as comprising or defining a plurality of capacitor storage node locations 15, 16, 17 and 18 on substrate 10. FIG. 1 can also be considered as depicting a capacitor array area 20 over substrate 10 within which a plurality of capacitors will be formed, in accordance with one preferred embodiment. Storage node locations 15, 16, 17 and 18 are exemplary only, and regardless may be conductive at this point in the process or made conductive subsequently.

A layer 22 has been formed over material 12 and capacitor storage node locations 15, 16, 17 and 18. A first material 24 is formed thereover. An exemplary preferred material for layer 22 comprises silicon nitride deposited to an exemplary thickness range of from 100 Angstroms to 2000 Angstroms, and can be considered as comprising an intervening layer received intermediate first material 24 and capacitor storage node locations 15, 16, 17 and 18. Intervening layer 22 might be included to provide an etch stop function as is described subsequently.

A preferred thickness range for first material 24 is from 0.5 micron to 10 microns. First material 24 might be electrically insulative, electrically conductive, or semiconductive. In one exemplary embodiment, first material 24 is entirely sacrificial and ultimately removed from the substrate. Exemplary preferred insulative materials include silicon nitride, doped or undoped silicon dioxide (i.e., BPSG), and/or spin on dielectrics. Exemplary conductive materials include TiN, ruthenium and TaN. An exemplary semiconductive material comprises silicon, for example polysilicon.

Figure 2:
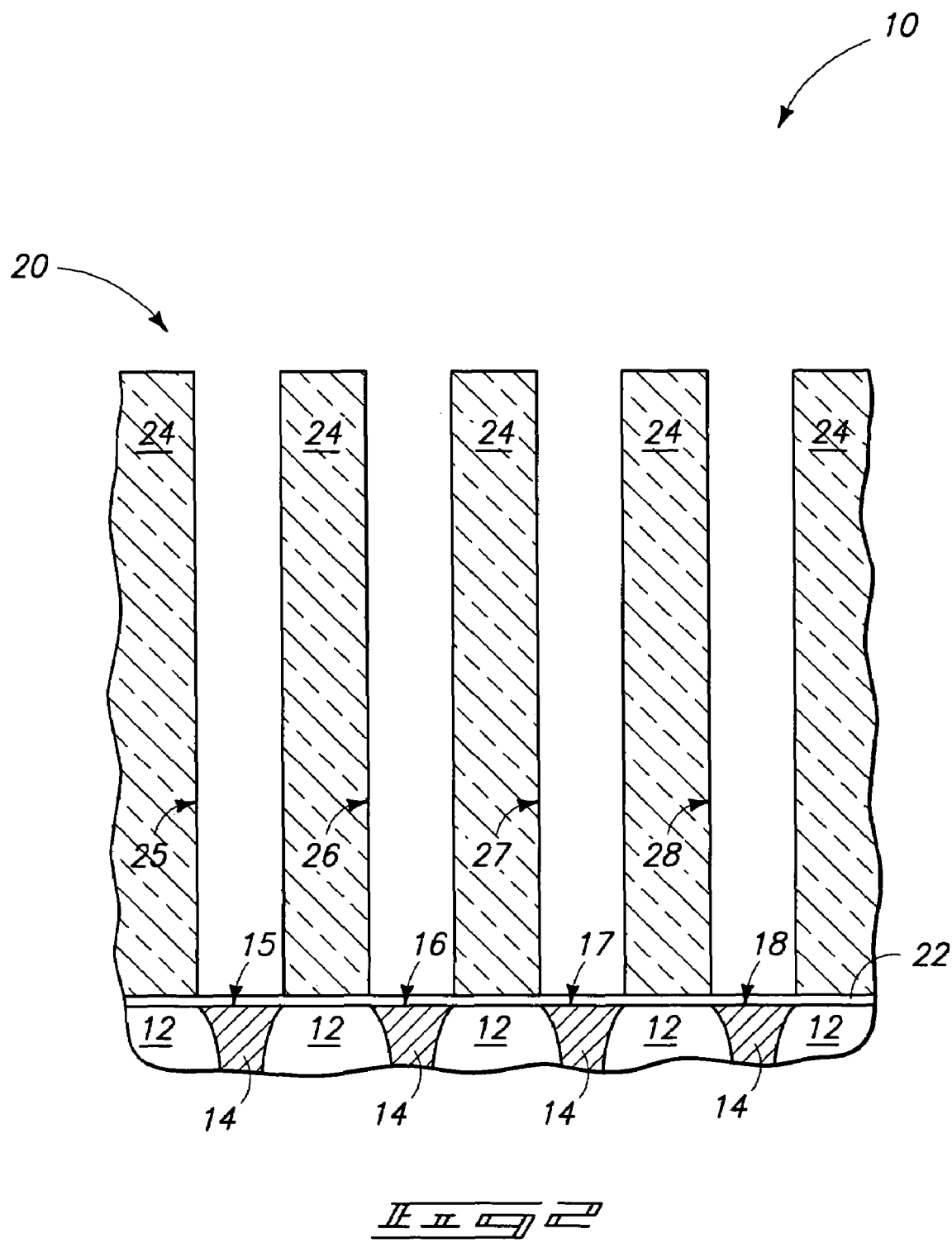
FIG. 2 is a view of the FIG. 1 substrate at a processing step subsequent to that shown by FIG. 1.

Referring to FIG. 2, a plurality of first openings 25, 26, 27 and 28 has been provided within first material 24 over capacitor storage node locations 15, 16, 17 and 18, respectively. Preferably, such are formed by chemical etching, for example utilizing photolithographic patterning for mask formation, followed by a suitable anisotropic chemical etch. Such openings can be of any desirable shape or shapes, for example any of circular, oval, elliptical, square, rectangular, etc. In the depicted exemplary embodiment, first material 24 is illustrated as having been etched selectively relative to intervening layer 22 whereby such selective etching does not expose capacitor storage nodes 15, 16, 17 and 18. In the context of this document, an etch which is "selective" or conducted "selectively" removes the material being etched at a rate of at least 2:1 relative to at least the immediately underlying layer. Alternately, openings 25, 26, 27 and 28 might be etched completely through intervening layer 22 at this point in the process or subsequently, or intervening layer 22 might not be provided prior to depositing first material 24, or such openings might extend to locations spaced above intervening layer 22.

Figure 3:
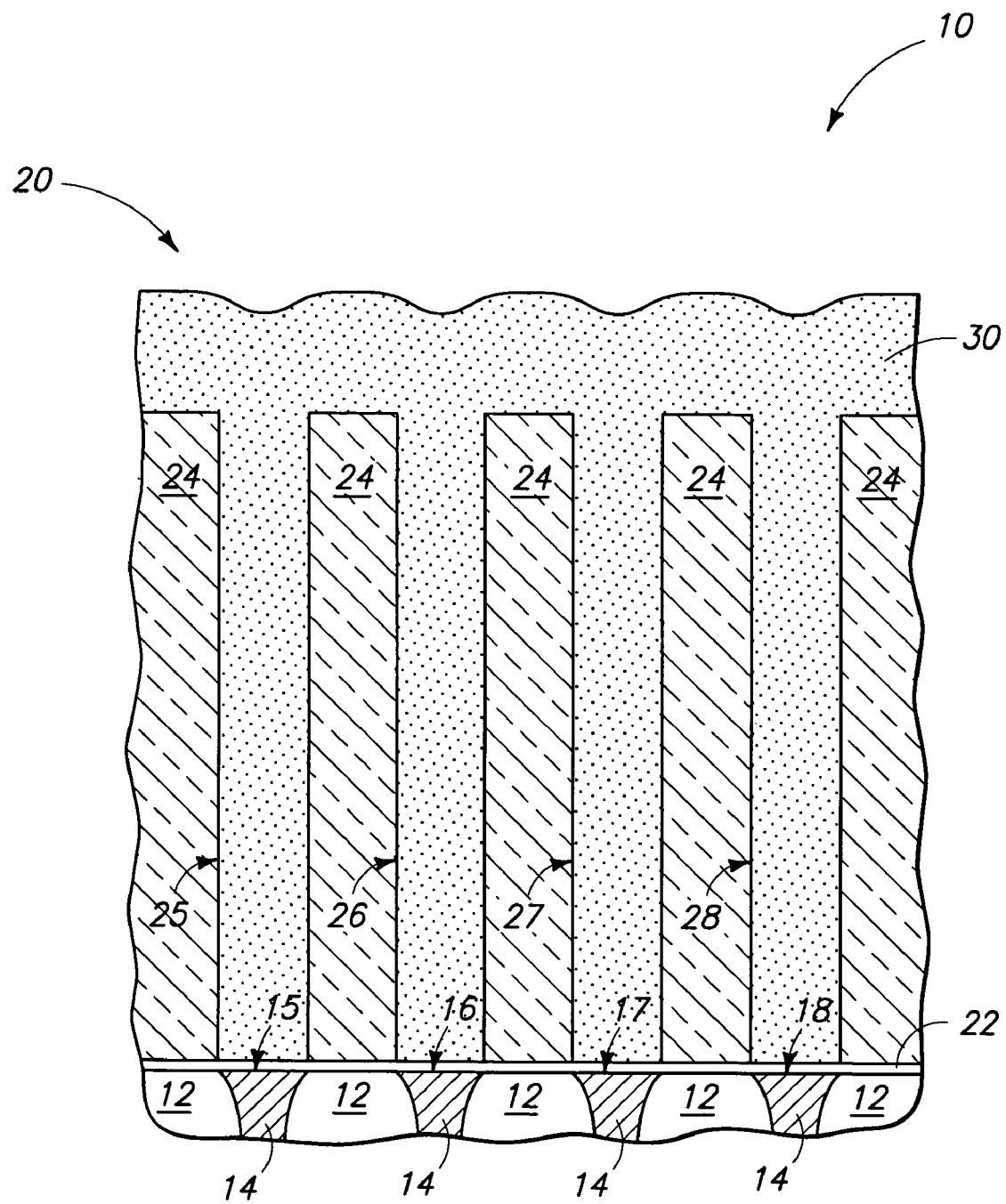
FIG. 3 is a view of the FIG. 2 substrate at a processing step subsequent to that shown by FIG. 2.

Referring to FIG. 3, a sacrificial material 30 has been deposited over first material 24 and to within first openings 25, 26, 27 and 28. Sacrificial material 30 is different in composition from first material 24, and might be electrically insulative, electrically conductive, or semiconductive. Exemplary preferred materials include any of those described above for first material 24, and where sacrificial material 30 and first material 24 are different. For example, and by way of example only, where first material 24 comprises BPSG, an exemplary preferred sacrificial material 30 comprises polysilicon. Material 30 may or may not extend to capacitor storage node locations 15, 16, 17, and 18 at this point in the process.

Figure 4:
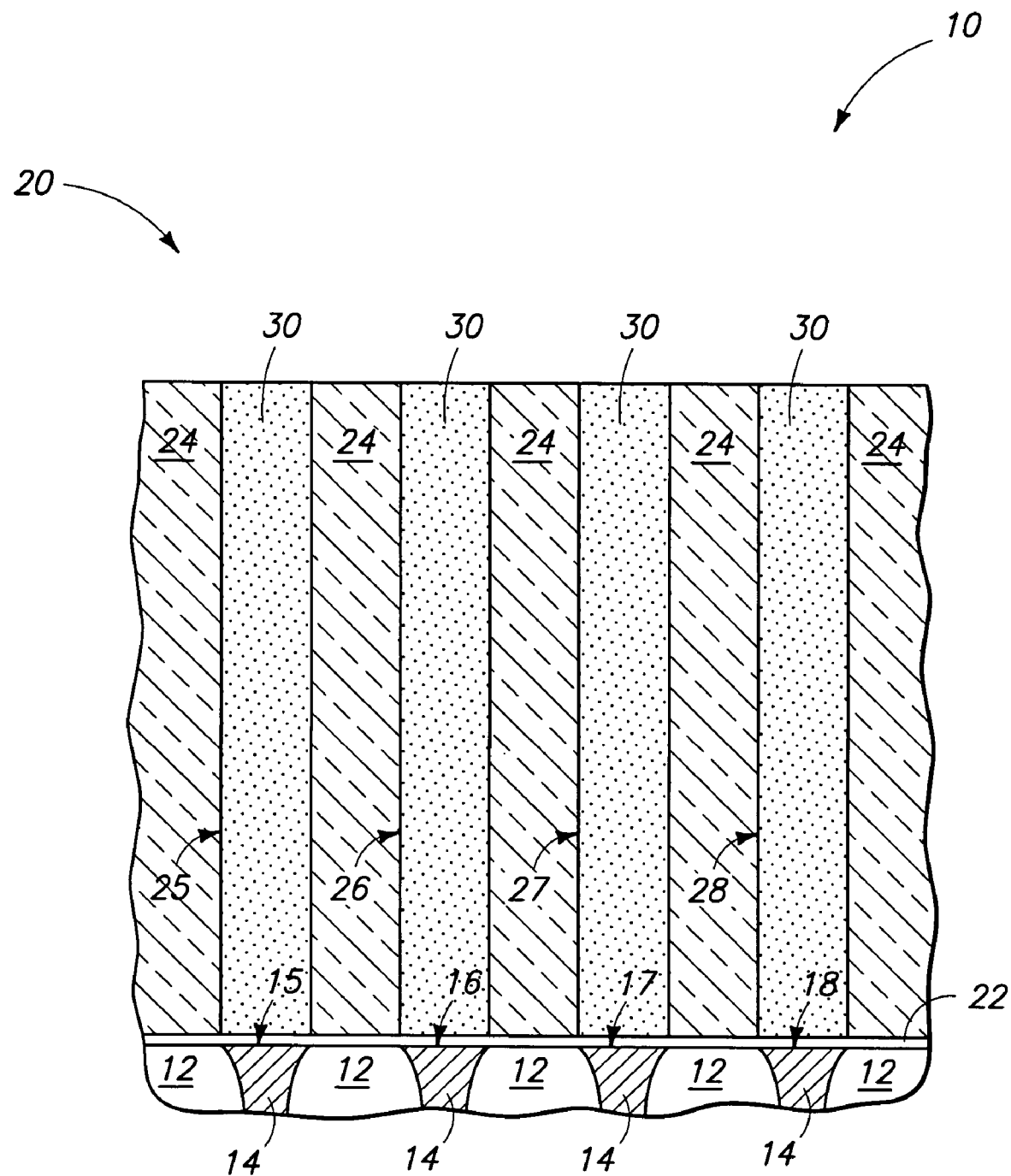
FIG. 4 is a view of the FIG. 3 substrate at a processing step subsequent to that shown by FIG. 3.

Referring to FIG. 4, sacrificial material 30 has been removed effective to expose first material 24 between openings 25, 26, 27 and 28. Exemplary preferred techniques include chemical mechanical polishing and resist etch back.

Figure 5:
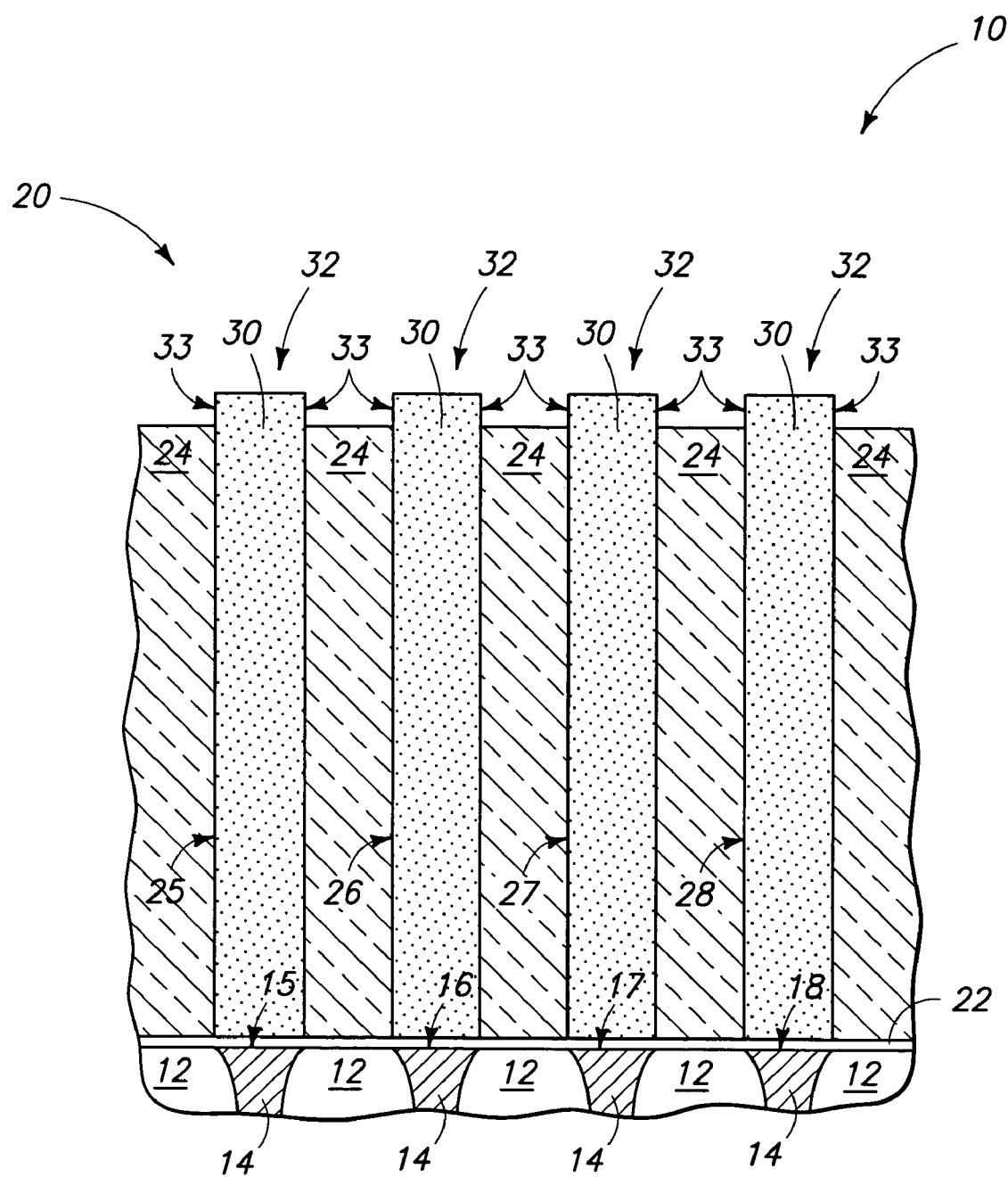
FIG. 5 is a view of the FIG. 4 substrate at a processing step subsequent to that shown by FIG. 4.

Referring to FIG. 5, first material 24 has been removed selectively relative to sacrificial material 30 to leave sacrificial material 30 within first openings 25, 26, 27 and 28 projecting elevationally outward of such openings in first material 24. An exemplary preferred technique for producing the FIG. 5 construction is by any suitable chemical etching that etches material 24 selectively relative to material 30. An etch stop layer might be employed, but is less desirable.

Such above processing describes but exemplary preferred methods of providing sacrificial material within the first openings which projects elevationally outward of the openings in the first material, for example in the preferred embodiment depicting sacrificial material projecting pillars 32 relative to material 24. Projecting pillars 32 can be considered as comprising sidewalls 33 over first material 24. An exemplary preferred length for sidewalls 33 is from 200 Angstroms to 1,000 Angstroms, with 500 Angstroms being a specific example.

Figure 6:
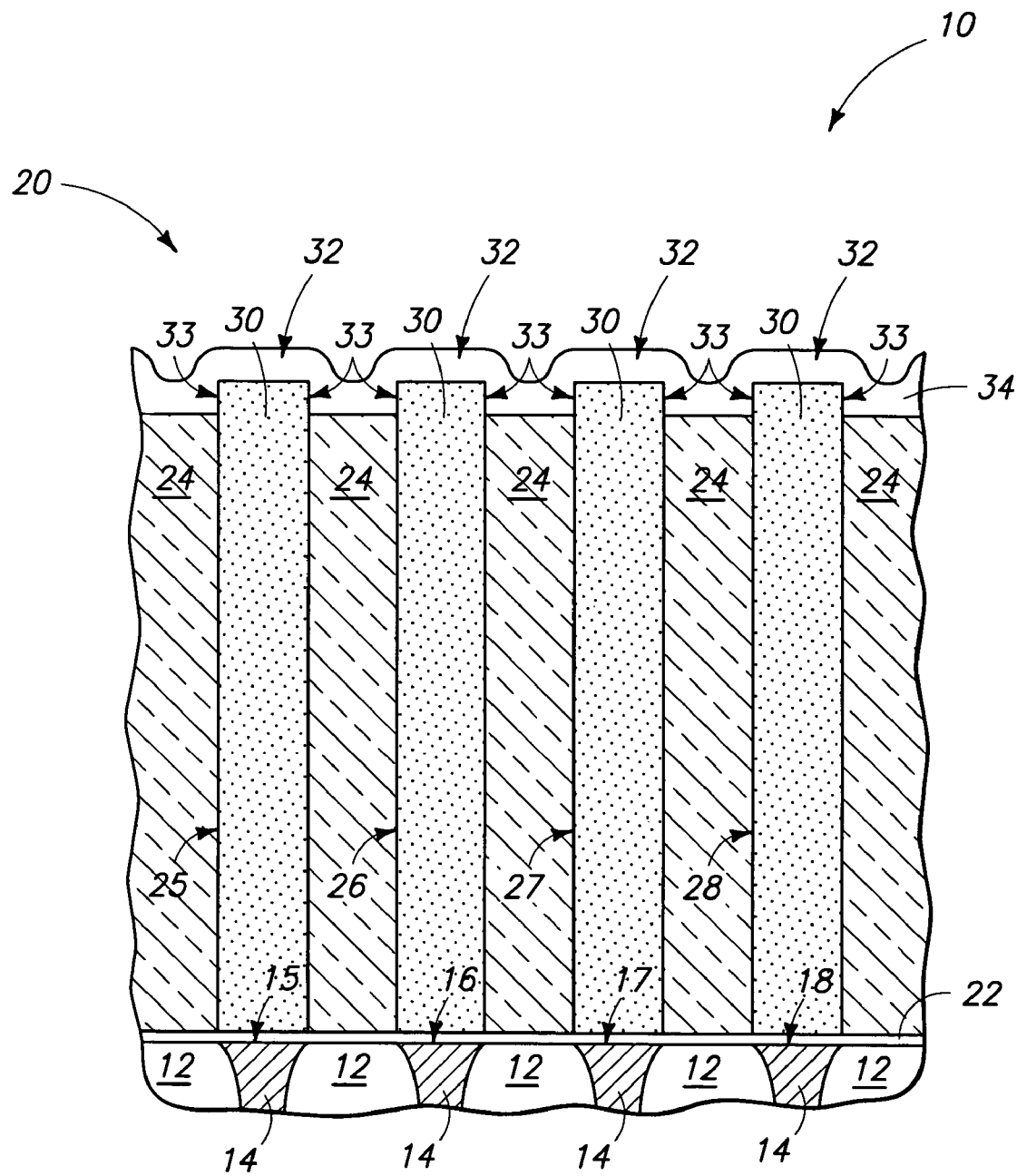
FIG. 6 is a view of the FIG. 5 substrate at a processing step subsequent to that shown by FIG. 5.

Referring to FIG. 6, an electrically insulative material 34 has been deposited over elevationally-projecting pillars 32 and over first material 24, and laterally about pillar sidewalls 33. Electrically insulative material 34 is different in composition from that of first material 24 and elevationally-projecting sacrificial material 34. By way of example only, exemplary preferred materials include electrically insulative nitrides, for example silicon nitride. An exemplary preferred thickness range for insulative material 34 is from 150 Angstroms to 750 Angstroms. A specific example, and by way of example only where the spacing between the illustrated pillars is 600 Angstroms, for layer 34 deposition thickness is 250 Angstroms.

Figure 7:
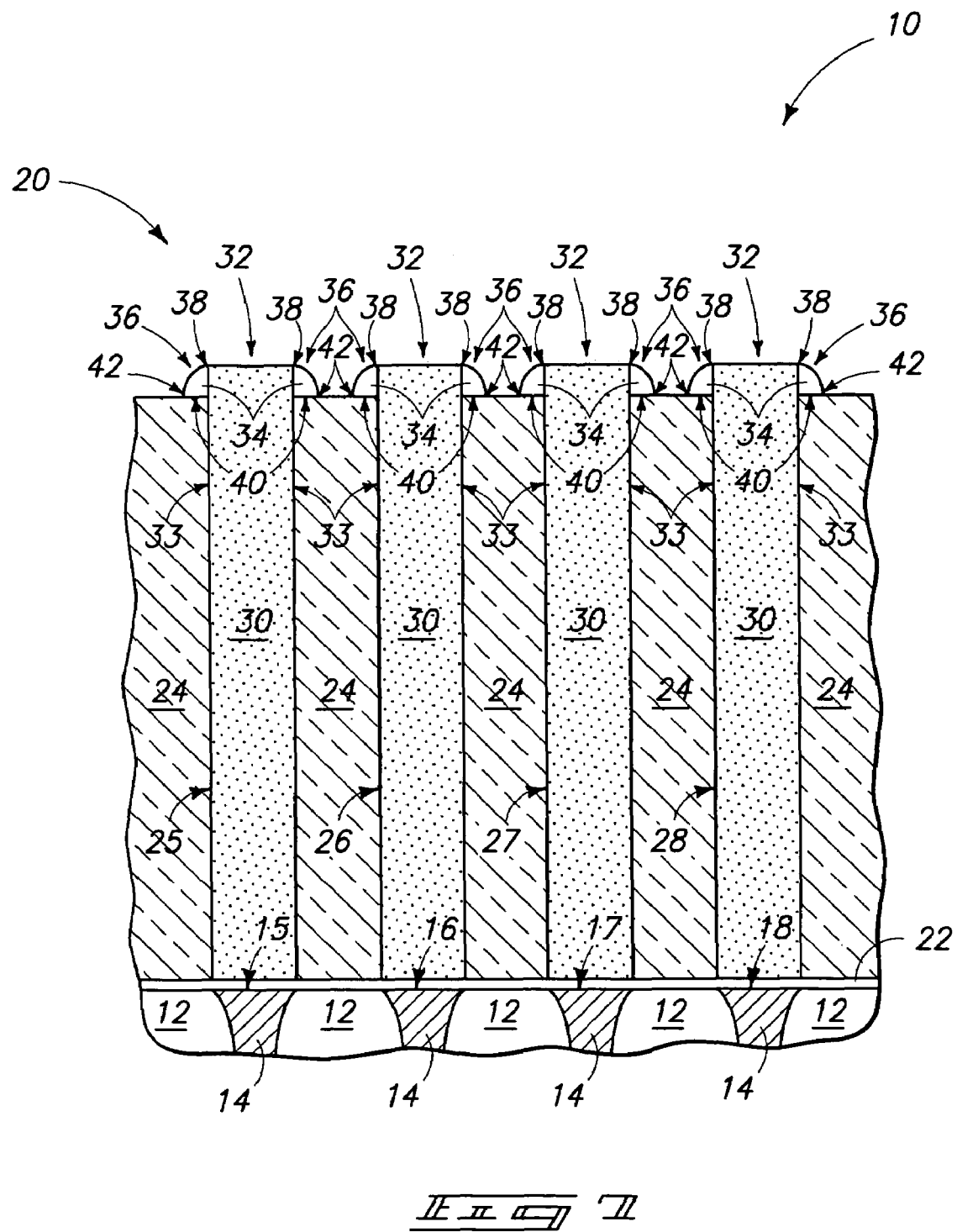
FIG. 7 is a view of the FIG. 6 substrate at a processing step subsequent to that shown by FIG. 6.

Referring to FIG. 7, electrically insulative material 34 has been anisotropically etched effective to expose first material 24 and leave electrically insulative material received laterally about elevationally-projecting sacrificial material 30. In one most preferred embodiment, such anisotropic etching is conducted without masking insulative material 34 anywhere within capacitor array area 20, and even more preferably without electrically insulative material 34 being masked anywhere on substrate 10 during such anisotropic etching, thereby not adding a masking step to the processing.

Referring to FIGS. 7 and 8, and in but one exemplary implementation, the anisotropic etching of insulative material 34 is depicted as forming an electrically insulative ring 36 about individual of the elevationally-projecting pillars 32/sacrificial material 30. In one preferred implementation and as depicted, rings 36 comprise respective elevationally outermost surfaces 38 and elevationally innermost surfaces 40 (FIG. 7), and wherein individual rings 36 are laterally wider at their elevationally innermost surface 40 than at their elevationally outermost surface 38. For purposes of the continuing discussion, and in one implementation, rings 36 can be considered as having a laterally peripheral surface 42, with each of such being spaced from an immediately adjacent ring 36.

FIG. 9 depicts an alternate embodiment substrate 10a to that depicted in FIG. 8. Like numerals form the first-described embodiment have been utilized where appropriate, with differences being indicated with different numerals and with the suffix "a". FIG. 9 depicts the anisotropic etching as having been effective to form a retaining structure 37 which essentially interconnects at least some of projecting pillars 32. Accordingly in FIG. 9, after such anisotropic etching, some of material 34a bridges between some immediately adjacent pillars 32, yet some of first material 24 is exposed between other immediately adjacent pillars 32. For example, material 34a between diagonally depicted pillars in the FIG. 9 layout is not bridging, while material 34a received between the depicted top and side adjacent pillars is bridging. Other pillar layouts than those depicted in FIGS. 8 and 9 are, of course, contemplated, regardless.

Referring to FIG. 10, a second material 46 has been deposited over elevationally-projecting sacrificial material pillars 32, over electrically insulative material 34, and over first material 24. Second material 46 is different in composition from that of electrically insulative material 34 and from sacrificial material 30. Second material 46 might be electrically insulative, electrically conductive, or semiconductive. Further, first material 24 and second material 46 might be of the same composition or of different compositions, and of course of the same or different relative resistivity/conductivity. Further by way of example only, one of first material 24 and second material 46 might be electrically insulative, electrically conductive, both electrically insulative, both electrically conductive, or one electrically insulative and one electrically conductive, as well as either or both being semiconductive. An exemplary preferred thickness range for material 46 is from 0.5 micron to 5 microns. A layer 48 is optionally provided over second material 46, and might be utilized in forming a capacitor electrode lattice support, for example as disclosed in U.S. Pat. No. 6,667,502, which is herein incorporated by reference. Silicon nitride is an exemplary preferred material for layer 48 where material 46 comprises a material other than silicon nitride.

Referring to FIG. 11, second openings 51, 52, 53 and 54 have been provided in second material 46 to elevationally-projecting sacrificial material 30 of pillars 32. An exemplary preferred technique includes photolithographic patterning and anisotropic etch.

Figure 12:
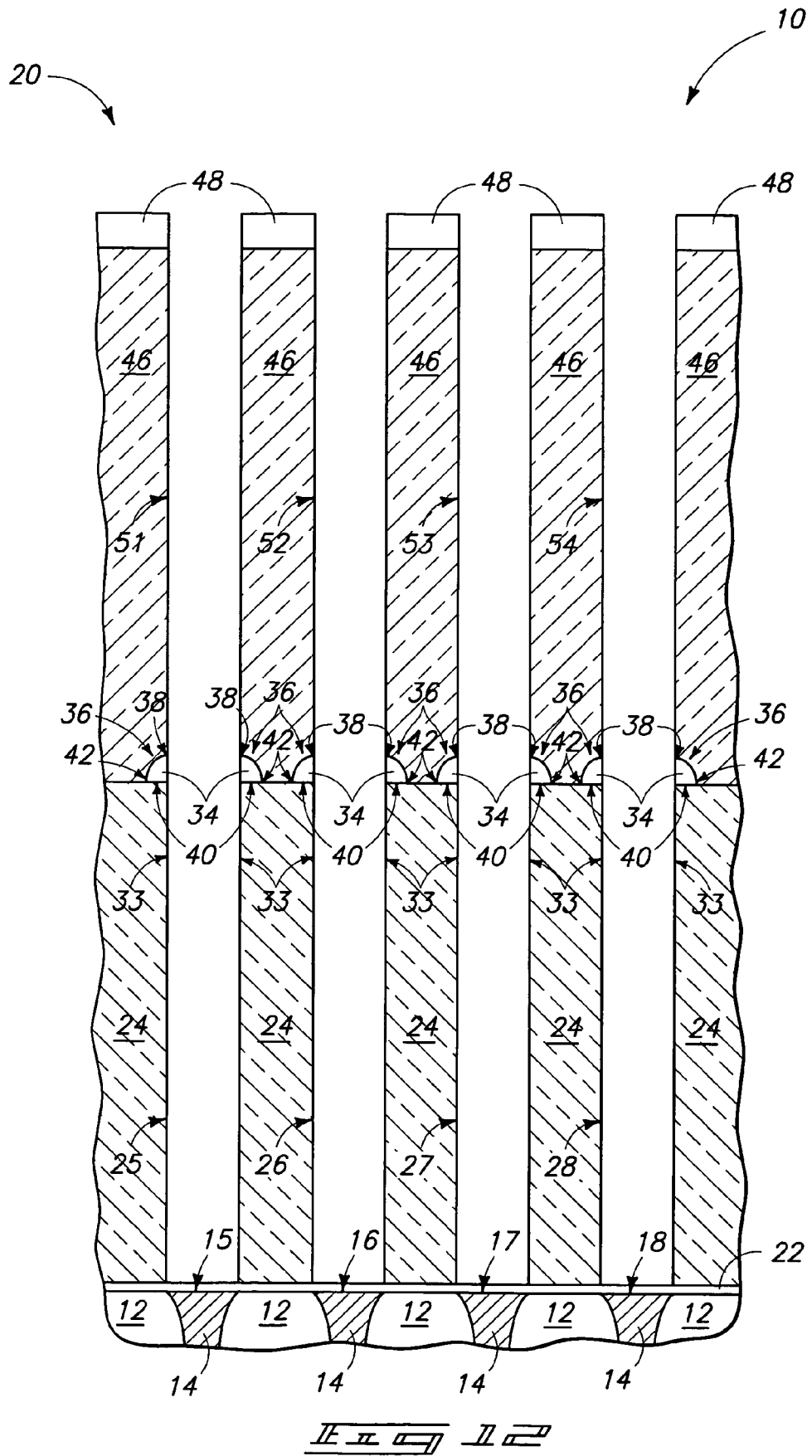
FIG. 12 is a view of the FIG. 11 substrate at a processing step subsequent to that shown by FIG. 11.
Figure 13:
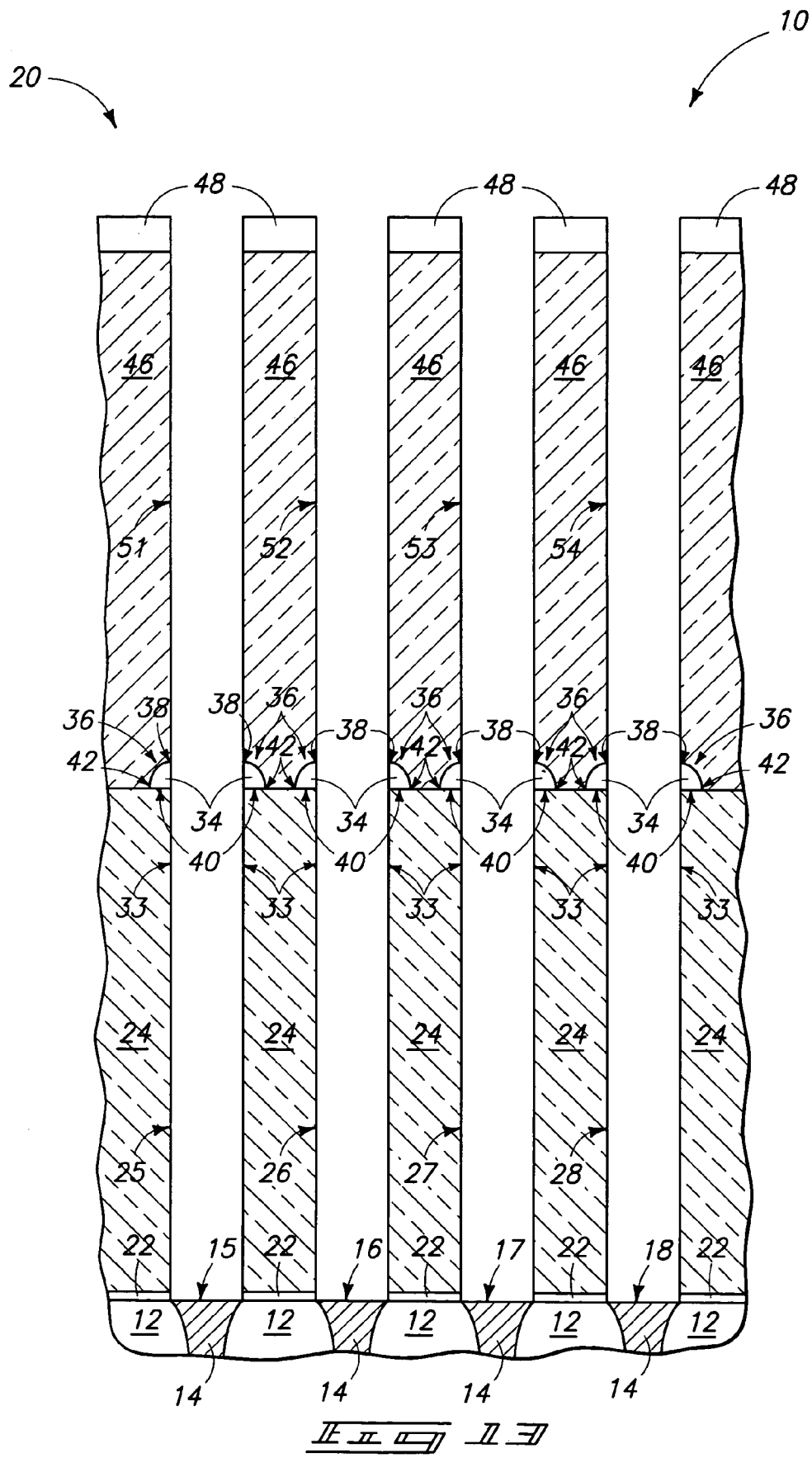
FIG. 13 is a view of the FIG. 12 substrate at a processing step subsequent to that shown by FIG. 12.

Referring to FIG. 12, sacrificial material 30 of pillars 32 have been etched from the substrate through openings 51, 52, 53 and 54. Where sacrificial material 30 extends through intervening layer 22 to capacitor storage node locations 15, 16, 17 and 18 (not shown), such etching will typically also expose capacitor storage node locations 15, 16, 17 and 18. It is desired that individual capacitor electrodes ultimately be formed in electrically connection with capacitor storage node locations 15, 16, 17 and 18. FIG. 13, by way of example only, depicts exposing such capacitor storage node locations, for example by etching intervening layer 22 after etching sacrificial material 30, typically by changing one or both of etching chemistry and parameter conditions.

Figure 14:
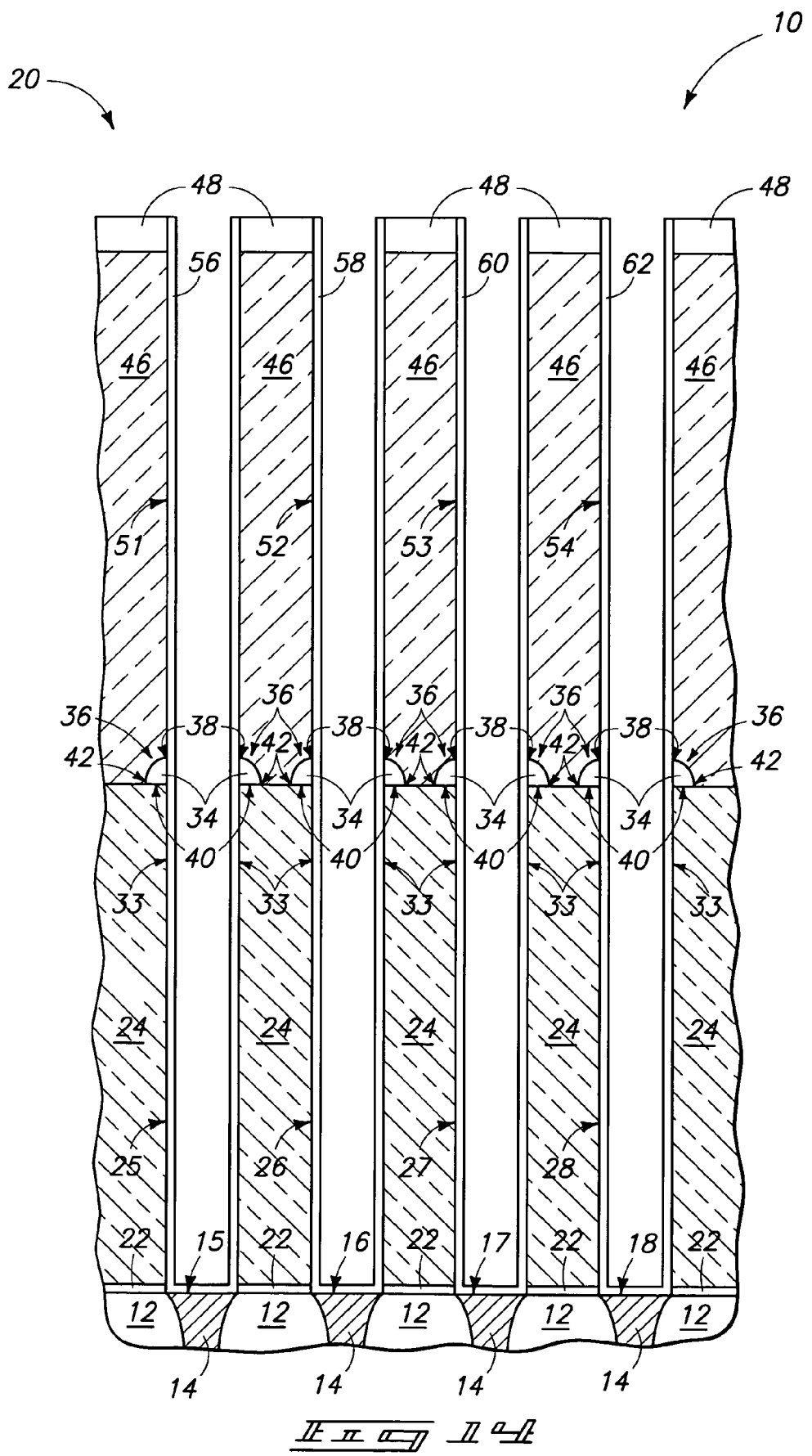
FIG. 14 is a view of the FIG. 13 substrate at a processing step subsequent to that shown by FIG. 13.

Referring to FIG. 14, individual capacitor electrodes 56, 58, 60 and 62 have been formed within first openings 25, 26, 27, and 28, respectively, and second openings 51, 52, 53, and 54, respectively, in electrical connection with individual capacitor storage node locations 15, 16, 17 and 18, respectively. In the depicted exemplary embodiment, individual of capacitor electrodes 56, 58, 60 and 62 comprise a respective container shape, although other configurations are also contemplated, and whether existing or yet-to-be developed. An exemplary preferred material for the individual capacitor electrodes is titanium nitride, although other conductive materials (including combinations of conductive materials) are also of course contemplated. Such might be deposited by any of physical vapor deposition, chemical vapor deposition, atomic layer deposition, and/or any other method whether existing or yet-to-be developed. Regardless, individual capacitor electrodes 56, 58, 60 and 62 have anisotropically etched electrically insulative material 34 received laterally about the outer sidewalls of the individual capacitor electrodes, and in the depicted preferred embodiment, such are received touching physically against (i.e., contacting) such outer sidewalls.

Figure 15:
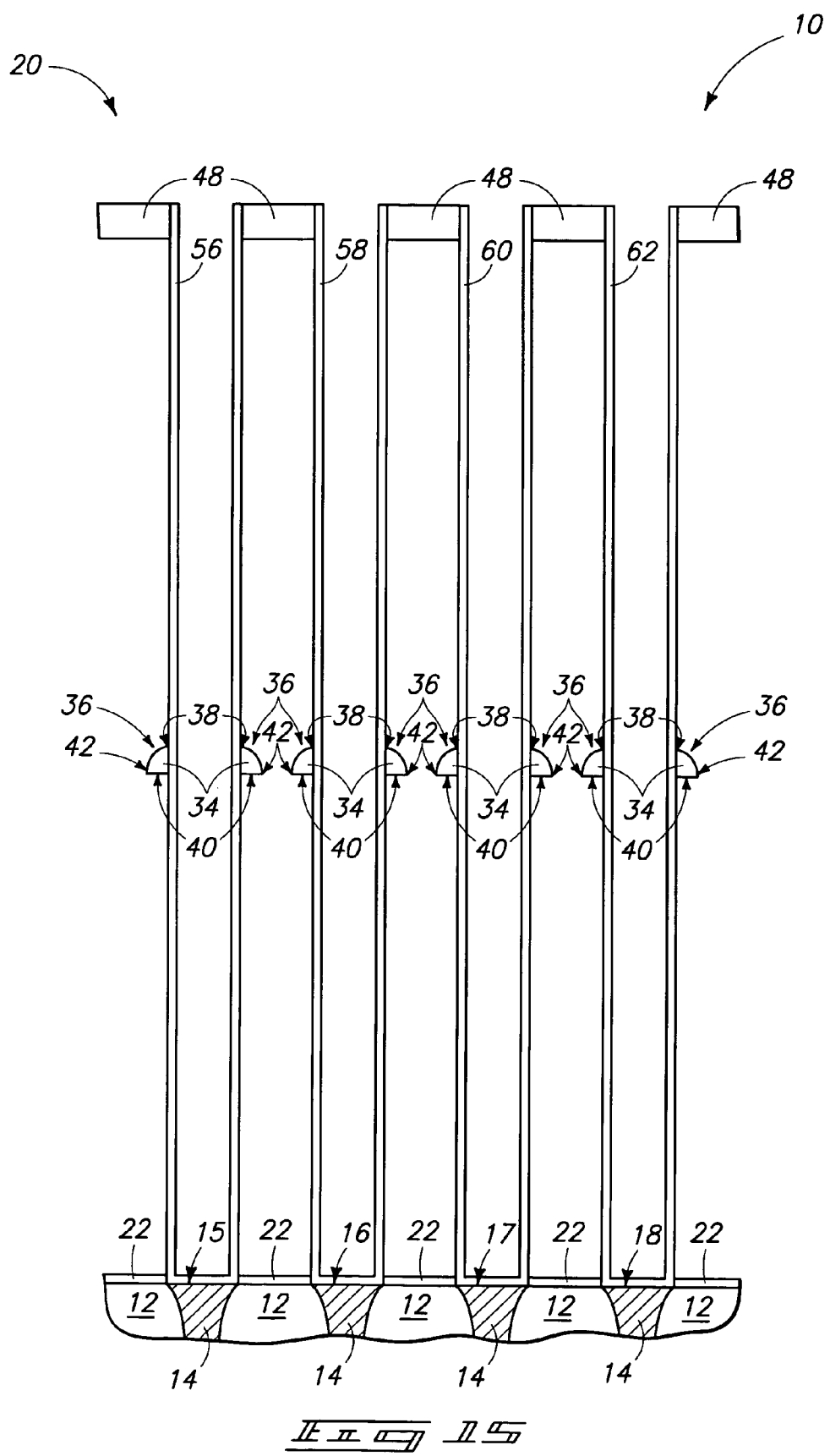
FIG. 15 is a view of the FIG. 14 substrate at a processing step subsequent to that shown by FIG. 14.

Referring to FIG. 15, first material 24 (not shown) and second material 46 (not shown) have been etched from the substrate. Where a lattice support/brace layer 48 is utilized as shown, some patterning thereof might be conducted prior to such etching to expose material 46 therebeneath if such has not been previously exposed.

Figure 16:
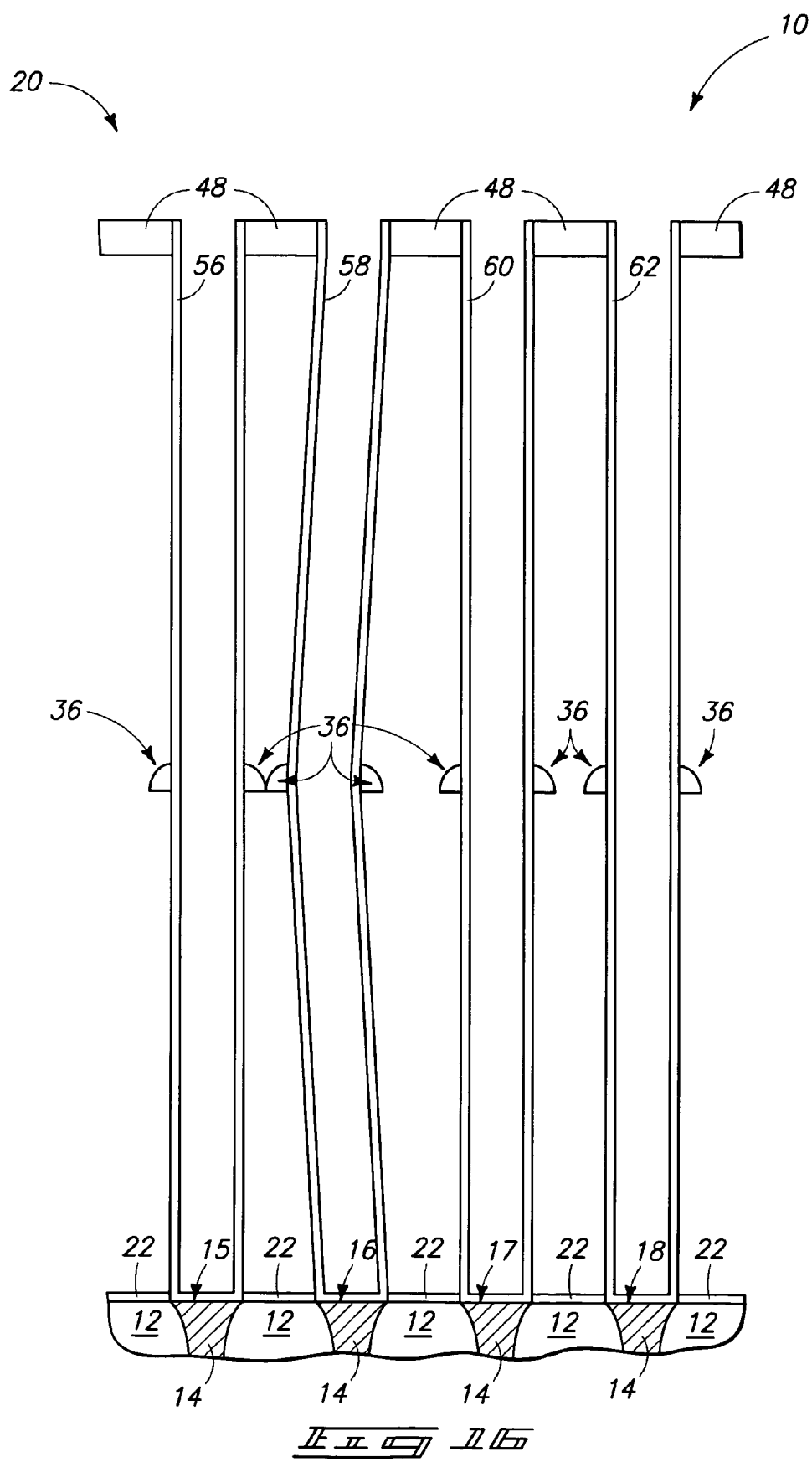
FIG. 16 is a view of the FIG. 15 substrate at a processing step subsequent to that shown by FIG. 15.

By way of example only, a purpose of the exemplary embodiment electrically insulative rings, or interconnected retaining structure, is to preclude high aspect ratio inner capacitor electrodes (i.e., those having an aspect ratio of at least 20, where aspect ratio is defined as maximum height of the electrode to minimum width of the electrode) from bowing outwardly towards their center or mid-elevation ranges, whereby shorting would likely occur with one or more immediately adjacent inner capacitor electrodes. For example and by way of example only, FIG. 16 depicts inner capacitor electrode 58 bowing centrally towards capacitor electrode 56 which might otherwise lead to a fatal circuit short. However, provision of the exemplary preferred embodiment electrically insulative rings 36 precludes shorting of inner capacitor electrode 58 with either of its immediately adjacent inner capacitor electrodes 56 or 60. Thereby in one exemplary implementation and aspect of the invention, some adjacent of insulative rings 36 might touch one another after the etching of the first and second materials. Such touching might result from or during the etching, or occur subsequent to the act of etching the first and second materials. A retaining structure like that shown in FIG. 9 could provide the same electrode spacing effect.

Figure 17:
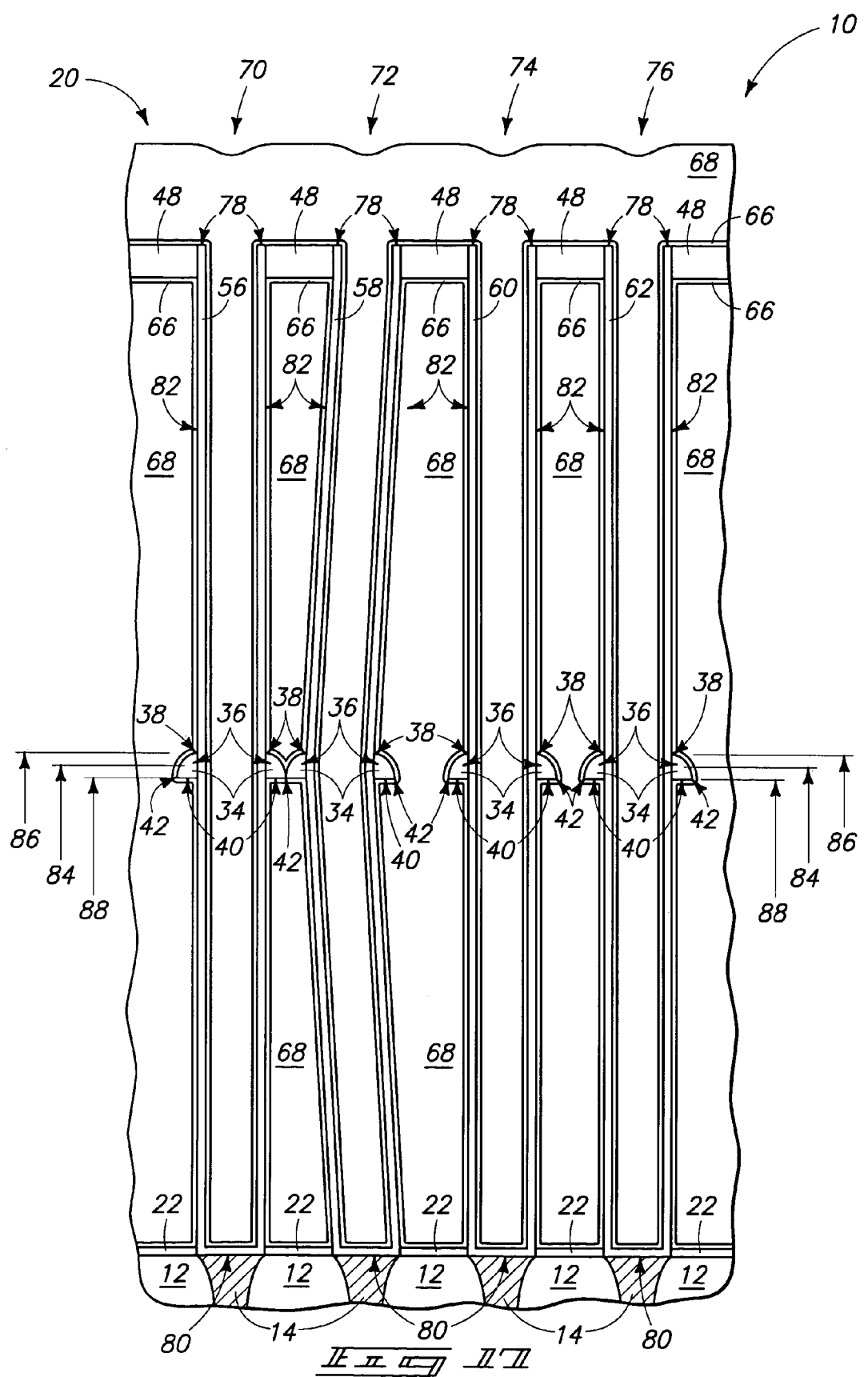
FIG. 17 is a view of the FIG. 16 substrate at a processing step subsequent to that shown by FIG. 16.

Regardless, the invention contemplates incorporating the individual capacitor electrodes having the anisotropically etched electrically insulative material received laterally about the capacitor electrode outer sidewalls into a plurality of capacitors. Such is, by way of example only, depicted with respect to FIG. 17. Such shows subsequent processing to that depicted by FIG. 16 whereby, for example, some central bowing of at least one capacitor electrode has occurred. FIG. 17 depicts a capacitor dielectric layer 66 having been deposited and received over each of insulative rings 36 and over inner capacitor electrodes 56, 58, 60 and 62. By way of example only, an exemplary preferred material is a silicon dioxide, silicon nitride, silicon dioxide composite, or any suitable high k dielectric, whether existing or yet-to-be developed. By way of example only, exemplary high k dielectrics include $Ta_2O_5$ and barium strontium titanate. Capacitor dielectric layer 66 might be commonly deposited as a single layer over each of the inner capacitor electrodes (shown and preferred) or might be separately provided with respect to individual capacitor electrodes.

Figure 19:
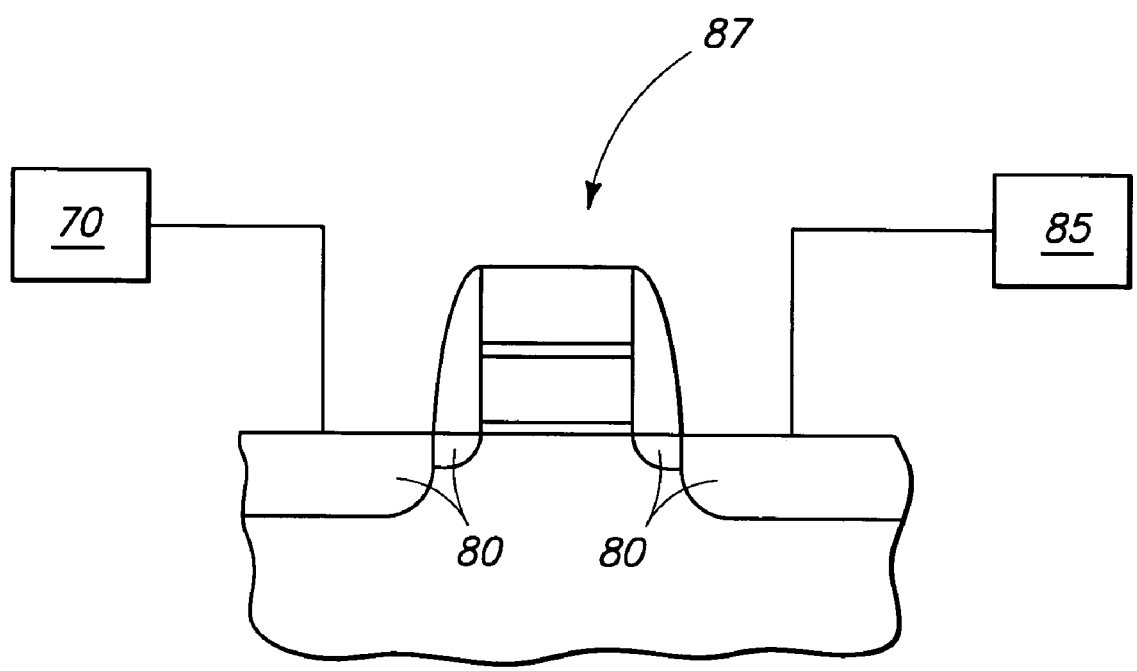
FIG. 19 is a diagrammatic representation of DRAM circuitry.

An outer capacitor electrode 68 is shown received over each of insulative rings 36 and over capacitor dielectric layer 66. Such is depicted as comprising a common cell capacitor plate to all the depicted capacitors, for example as might be utilized in DRAM or other circuitry. For example and by way of example only, FIG. 19 depicts an exemplary DRAM cell incorporating capacitor 70. Such comprises an exemplary transistor gate word line 87 having insulative sidewall spacers, an insulative cap, a conductive region under the cap such as a silicide, a conductive polysilicon region under the silicide and a gate dielectric region under the polysilicon. Source/drain diffusion regions 80 are shown formed within semiconductive material operatively proximate word line 87. One of such electrically connects with capacitor 70, and another such electrically connects with a bit line 85. Of course alternately with respect to FIG. 17, separate outer capacitor electrodes might be configured with respect to each individual inner capacitor electrode or groups of individual capacitor electrodes.

In certain aspects, the invention also encompasses circuitry comprising a pair of adjacent capacitors independent of method of fabrication. For example, FIG. 17 depicts circuitry comprising capacitors 70, 72, 74 and 76. Further, by way of example only, capacitors 74 and 76 can be considered as a pair of adjacent capacitors comprising substantially vertically oriented inner capacitor electrodes 60 and 62 having respective elevationally outermost surfaces 78 and elevationally innermost surfaces 80. Further, inner capacitor electrodes 60 and 62 have outer sidewalls 82. Inner capacitor electrodes 60 and 62 preferably have aspect ratios of at least 20:1. Further and regardless, in the depicted preferred embodiment, inner capacitor electrodes 58 and 60 comprise respective container shapes.

An electrically insulative ring 36 is received laterally about each of inner capacitor electrode outer sidewalls 82 at some common substrate elevation intermediate outermost surfaces 78 and innermost surfaces 80. For example, FIG. 17 depicts an exemplary common elevation 84 at which at least some portions of insulative rings 36 are received for each of capacitor pair 74 and 76. Further, insulative rings 36 received about inner capacitor electrode outer sidewalls 82 of inner capacitor electrodes 60 and 62 are spaced from one another. Preferably, the rings comprise a nitride, for example silicon nitride. In one particular preferred embodiment, the rings have respective elevationally outermost and innermost surfaces, for example surfaces 38 and 40, respectively. Such individual rings 36 about inner capacitor electrodes 60 and 62 are laterally wider at their elevationally innermost surface 40 than at their elevationally outermost surface 38. Further in the depicted exemplary preferred embodiment, elevationally outermost surface 38 of each ring 36 is received at one common substrate elevation (i.e., substrate elevation 86, as shown), and elevationally innermost surface 40 of each ring 36 is received at another common substrate elevation (i.e., substrate elevation 88, as shown). Regardless, FIG. 17 also depicts rings 36 being received physically touching against electrode outer sidewalls 82.

In one implementation, aspects of the invention also contemplate circuitry comprising a pair of adjacent capacitors wherein insulative rings touch one another, for example as depicted with respect to the pair of adjacent capacitors 70 and 72. Insulative ring 36 received about inner capacitor electrode 58 of capacitor 72, and insulative ring 36 received about inner capacitor electrode 56 of capacitor 70, can each be considered as having a laterally peripheral surface, for example peripheral surface 42. Such laterally peripheral surfaces of each ring 36 are depicted as touching one another intermediate capacitor 70 and capacitor 72. Other preferred attributes are as described above with respect to a pair of adjacent capacitors described independent of method with respect to a pair of adjacent capacitor wherein electrically insulative rings are spaced from one another.

Figure 18:
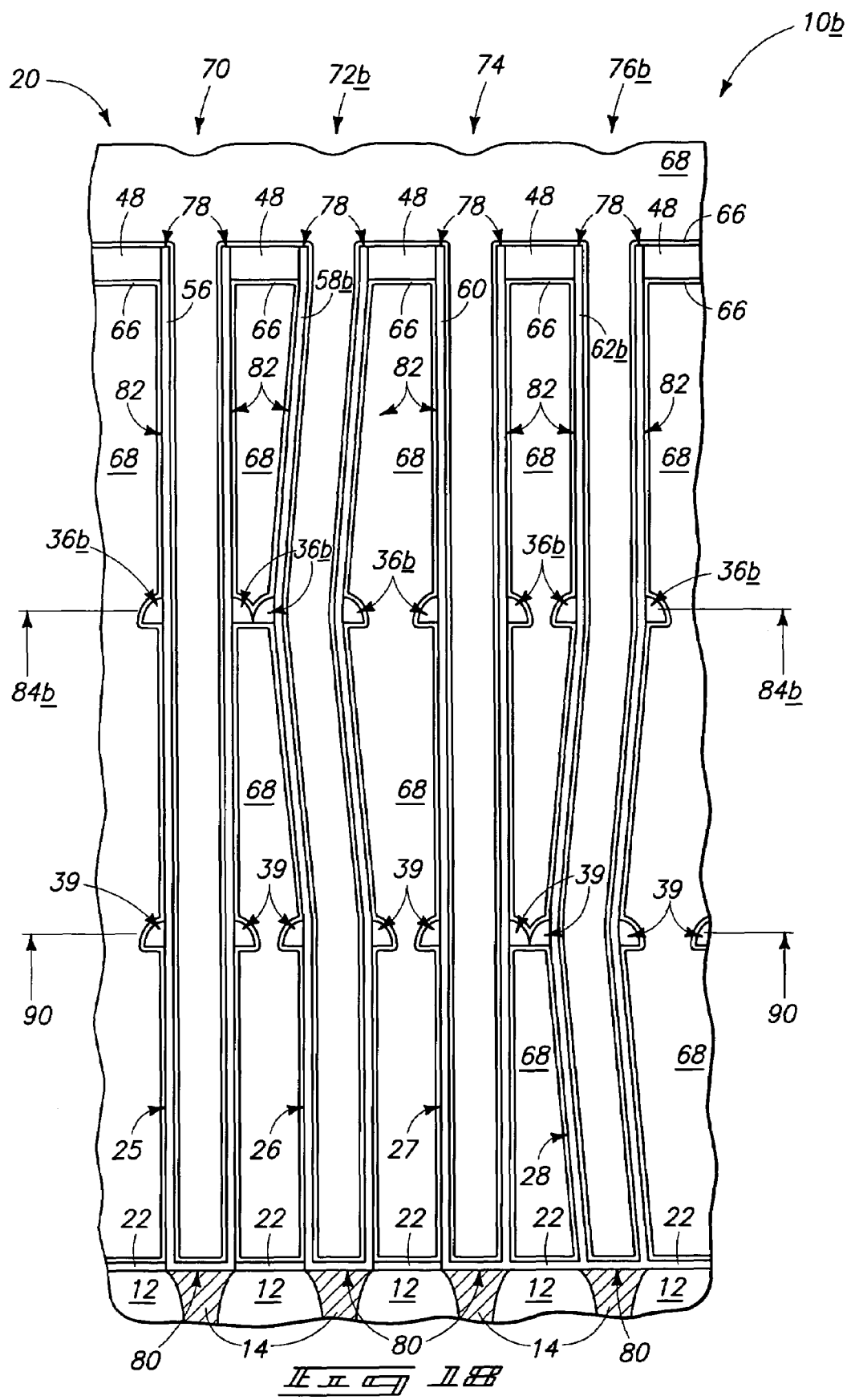
FIG. 18 is a diagrammatic cross section of an alternate substrate fragment in accordance with an aspect of the invention.

Methodical and structural aspects of the invention contemplate forming more than one of the depicted retaining structures or insulative rings about the outer sidewalls of the inner capacitor electrodes. For example, and by way of example only, FIG. 18 depicts an alternate exemplary embodiment substrate 10*b*. Like numerals from the first-described embodiment have been utilized where appropriate, with differences being indicated with the suffix "b" or with different numerals. FIG. 18 depict individual rings 36*b* and another electrically insulative ring 39 received laterally about outer sidewalls 82 of each inner capacitor electrode 56, 58, 60 and 62. Rings 36*b* are shown optionally moved to a different substrate common elevation 84*b*, and rings 39 are at some another common substrate elevation (i.e., substrate elevation 90) intermediate the elevationally outermost surface and the elevationally innermost surface of such inner capacitor electrodes. Such another insulative rings might be spaced from one another, with respect to certain capacitor pairs, or might touch one another intermediate a pair of adjacent capacitors, for example depending on degree (if any) of bowing of individual of the inner capacitor electrodes.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a plurality of capacitors, comprising:
    forming sacrificial material pillars projecting outwardly from openings in a first material over individual capacitor storage node locations within a capacitor array area over a substrate;
    depositing electrically insulative material different in composition from the first material over the first material laterally about sidewalls of the projecting pillars and anisotropically etching the electrically insulative material without masking it anywhere within the capacitor array effective to expose underlying first material and leave electrically insulative material received laterally about the sidewalls of the projecting pillars;
    forming openings within a second material to the pillars, the second material being different in composition from the electrically insulative material and from the pillars;
    etching the pillars from the substrate through the openings in the second material and forming individual capacitor electrodes within the openings in electrical connection with the capacitor storage node locations, the individual capacitor electrodes having the anisotropically etched electrically insulative material received laterally about outer sidewalls of the individual capacitor electrodes; and
    incorporating the individual capacitor electrodes having the anisotropically etched electrically insulative material received laterally about the capacitor electrode outer sidewalls into a plurality of capacitors.

2. The method of claim 1 wherein the individual capacitor electrodes have the anisotropically etched electrically insulative material physically touching against the outer sidewalls of the individual capacitor electrodes.

3. The method of claim 1 wherein the electrically insulative material is not masked anywhere on the substrate during said anisotropic etching.

4. The method of claim 1 wherein individual of the capacitor electrodes comprises a container shape.

5. The method of claim 1 wherein the first and second materials are of the same composition.

6. The method of claim 1 wherein the first and second materials are of different compositions.

7. The method of claim 1 wherein the first and second materials comprise oxides, the pillars comprise polysilicon, and the electrically insulative material comprises silicon nitride.

8. The method of claim 1 wherein at least one of the first and second materials is electrically insulative.

9. The method of claim 8 wherein both of the first and second materials are electrically insulative.

10. The method of claim 1 wherein at least one of the first and second materials is electrically conductive.

11. The method of claim 10 wherein both of the first and second materials are electrically conductive.

12. The method of claim 1 wherein at least one of the first and second materials is semiconductive.

13. The method of claim 1 wherein the anisotropic etching forms an electrically insulative ring about each of the pillars, individual of the insulative rings being received about the outer lateral sidewalls of the individual capacitor electrodes.

14. The method of claim 13 wherein the rings received about the outer lateral sidewalls of the individual capacitor electrodes comprise respective elevationally outermost and innermost surfaces, the individual rings being laterally wider at their elevationally innermost surface than at their elevationally outermost surface.

15. The method of claim 13 comprising etching said first and second materials after forming the individual capacitor electrodes, some adjacent of the insulative rings touching one another after said etching of the first and second materials.

16. The method of claim 15 wherein the rings received about the outer lateral sidewalls of the individual capacitor electrodes comprise respective elevationally outermost and innermost surfaces, the individual rings being laterally wider at their elevationally innermost surface than at their elevationally outermost surface.

17. The method of claim 1 wherein the anisotropic etching forms a retaining structure interconnecting at least some of the individual capacitor electrodes within the capacitor array area.

18. The method of claim 17 wherein the anisotropic etching forms a retaining structure interconnecting all of the individual capacitor electrodes within the capacitor array area.

19. The method of claim 1 comprising forming the individual capacitor electrodes to have aspect ratios of at least 20:1.

20. A method of forming a plurality of capacitors, sequentially comprising:
    providing a plurality of first openings within a first material over capacitor storage node locations on a substrate;
    providing sacrificial material within the first openings which projects elevationally outward of the openings in the first material;
    depositing an electrically insulative material over the elevationally-projecting sacrificial material and over the first material, the electrically insulative material being different in composition from the first material and from the sacrificial material;
    anisotropically etching the electrically insulative material effective to expose the first material and leave electrically insulative material received laterally about the elevationally-projecting sacrificial material;
    depositing a second material over the elevationally-projecting sacrificial material, over the electrically insulative material and over the first material; the second material being different in composition from that of the electrically insulative material and from the sacrificial material;
    providing second openings in the second material to the elevationally-projecting sacrificial material;
    etching the sacrificial material and exposing the capacitor storage node locations;
    forming individual capacitor electrodes within the first and second openings in electrical connection with the individual capacitor storage node locations, the individual capacitor electrodes having the anisotropically etched electrically insulative material received laterally about outer sidewalls of the individual capacitor electrodes; and
    etching the first material and the second material from the substrate and incorporating the individual capacitor electrodes having the anisotropically etched electrically insulative material received laterally about the capacitor electrode outer sidewalls into a plurality of capacitors.

21. The method of claim 20 wherein providing the sacrificial material within the first openings which projects elevationally outward of the openings in the first material, sequentially comprises:
   depositing the sacrificial material over the first material and within the first openings;
   polishing the sacrificial material effective to expose the first material between the openings; and
   removing the first material selectively relative to the sacrificial material.

22. The method of claim 20 wherein the anisotropic etching forms an electrically insulative ring about individual of the elevationally-projecting sacrificial material, individual of the insulative rings being received about the outer lateral sidewalls of the individual capacitor electrodes.

23. The method of claim 22 wherein the rings received about the outer lateral sidewalls of the individual capacitor electrodes comprise respective elevationally outermost and innermost surfaces, the individual rings being laterally wider at their elevationally innermost surface than at their elevationally outermost surface.

24. The method of claim 22 wherein some adjacent of the insulative rings touch one another after said etching of the first and second materials.

25. The method of claim 24 wherein the rings received about the outer lateral sidewalls of the individual capacitor electrodes comprise respective elevationally outermost and innermost surfaces, the individual rings being laterally wider at their elevationally innermost surface than at their elevationally outermost surface.

26. The method of claim 20 wherein the anisotropic etching forms a retaining structure interconnecting at least some of the individual capacitor electrodes.

27. The method of claim 26 wherein the anisotropic etching forms a retaining structure interconnecting all of the individual capacitor electrodes.

28. The method of claim 20 wherein the electrically insulative material is not masked anywhere on the substrate during said anisotropic etching.

29. The method of claim 20 wherein individual of the capacitor electrodes comprises a container shape.

30. The method of claim 20 wherein the first and second materials are of the same composition.

31. The method of claim 20 wherein the first and second materials are of different compositions.

32. The method of claim 20 wherein at least one of the first and second materials is electrically insulative.

33. The method of claim 32 wherein both of the first and second materials are electrically insulative.

34. The method of claim 20 wherein at least one of the first and second materials is electrically conductive.

35. The method of claim 34 wherein both of the first and second materials are electrically conductive.

36. The method of claim 20 wherein at least one of the first and second materials is semiconductive.

37. The method of claim 20 wherein the sacrificial material is semiconductive.

38. The method of claim 20 wherein the sacrificial material is electrically insulative.

39. The method of claim 20 wherein the sacrificial material is electrically conductive.

40. The method of claim 20 comprising providing an intervening layer intermediate the first material and the capacitor storage node locations.

41. The method of claim 40 wherein the sacrificial material extends through the intervening layer to the capacitor storage node locations.

42. The method of claim 40 wherein the sacrificial material does not extend through the intervening layer to the capacitor storage node locations, and wherein exposing the capacitor storage node locations comprises etching the intervening layer.

43. The method of claim 42 wherein providing the plurality of first openings comprises etching the first material selectively relative to the intervening layer whereby such selective etching does not expose the capacitor storage nodes.

44. The method of claim 20 comprising forming the individual capacitor electrodes to have aspect ratios of at least 20:1.

45. The method of claim 20 wherein the individual capacitor electrodes have the anisotropically etched electrically insulative material physically touching against the outer sidewalls of the individual capacitor electrodes.

* * * * *